United States Patent [19]

Yokogawa et al.

[11] Patent Number: 5,822,347
[45] Date of Patent: Oct. 13, 1998

[54] SEMICONDUCTOR LIGHT EMITTING DEVICE AND METHOD FOR FABRICATING THE SAME

[75] Inventors: Toshiya Yokogawa, Nara; Shigeo Yoshii, Nagaokakyo; Yoichi Sasai, Hirakata, all of Japan

[73] Assignee: Matsushita Electric Industrial Co., Ltd., Osaka, Japan

[21] Appl. No.: 589,488

[22] Filed: Jan. 22, 1996

[30] Foreign Application Priority Data

Jan. 20, 1995 [JP] Japan ................................. 7-007414
Jun. 13, 1995 [JP] Japan ................................. 7-145986

[51] Int. Cl.$^6$ .............................. H01S 3/19; H01L 29/22; H01L 33/00
[52] U.S. Cl. .............................. 372/45; 372/46; 257/78; 257/76
[58] Field of Search ................... 372/43, 44, 45, 372/46, 96, 92, 99; 257/78, 94, 96, 97, 103

[56] References Cited

U.S. PATENT DOCUMENTS

| | | |
|---|---|---|
| 4,468,285 | 8/1984 | Bayman et al. . |
| 4,607,369 | 8/1986 | Niina et al. ................... 372/46 |
| 4,916,496 | 4/1990 | Tomomura et al. . |
| 5,020,066 | 5/1991 | Iga et al. ...................... 372/45 |
| 5,193,098 | 3/1993 | Welch et al. .................. 372/46 |
| 5,299,217 | 3/1994 | Migita et al. . |
| 5,317,584 | 5/1994 | Mori et al. ................... 372/45 |
| 5,404,027 | 4/1995 | Haase et al. .................. 372/45 |
| 5,477,063 | 12/1995 | Shakuda ...................... 372/45 |
| 5,567,646 | 10/1996 | Haberern ..................... 437/129 |

FOREIGN PATENT DOCUMENTS

| | | |
|---|---|---|
| 0 619 602 A2 | 10/1994 | European Pat. Off. . |
| 0 632 553 | 1/1995 | European Pat. Off. . |
| 55-50462 | 4/1980 | Japan . |
| 60-62173 | 4/1985 | Japan . |
| 60-160622 | 8/1985 | Japan . |
| WO 93/23883 | 11/1993 | WIPO . |

OTHER PUBLICATIONS

European Search Report dated Jun. 17, 1996.
W. Bala et al., "(Fr–P–30) The Influence of In, Ga and Ag Dopants on the Electroluminesence of ZnSe–ZnO Diodes", ACTA Physica Polonica, vol. A71 (1987), pp. 469–471 (No Month).
A. Sher, et al., "Fabrication of n–Native Oxide / p–ZnTE Heterojunctions by the Anodic Oxidation of ZnTe MBE Layers", Journal of Elec. Materials, vol. 21, No. 6, pp. 653–657, (1992) (No Month).

(List continued on next page.)

*Primary Examiner*—Rodney B. Bovernick
*Assistant Examiner*—Luong-Quyen T. Phan
*Attorney, Agent, or Firm*—Ratner & Prestia

[57] ABSTRACT

In a II–VI group semiconductor laser, on an n type GaAs substrate, an n type ZnSe layer, a multiquantum well layer of a ZnCdSe well layer and a ZnSe barrier layer, and a p type ZnSe layer are deposited in this order. A polycrystalline ZnO layer is provided on both sides of the p type ZnSe layer for constricting current. Multifilm reflecting mirrors, respectively constituted with a polycrystalline $SiO_2$ layer and a polycrystalline $TiO_2$ layer, for obtaining laser oscillation are provided on the p type ZnSe layer as well as on a surface of the n type ZnSe layer exposed by etching the GaAs substrate. Furthermore, a p type AuPd electrode and an n type AuGeNi electrode are respectively provided. Alternatively, on an n type GaAs substrate, an n type ZnSe epitaxial layer, an n type ZnMgSSe cladding layer, an n type ZnSSe optical waveguide layer, a ZnCdSe active layer, a p type ZnSSe optical waveguide layer, a p type ZnMgSSe cladding layer, a p type ZnTe contact layer and a polycrystalline ZnO burying layer are respectively formed. Furthermore, a p type AuPd electrode and an n type In electrode are respectively provided.

27 Claims, 26 Drawing Sheets

OTHER PUBLICATIONS

J. C. Mabon et al., "Optimization and Evaluation of Black Zinc Selective Solar Asorber Surfaces", Thin Solid Films, vol. 115, pp. 51–73 (1984) (No Month).

S. J. Pearton et al., "Plasma etching of ZnS, ZnSe, CdS, and CdTe in electron cyclotron resonance $CH_4/H_2/Ar$ and $H_2/Ar$ discharges," J. Vac. Sci. Technol. B, vol. 11, No. 1, pp. 15–19, (1993) (Jan./Feb.).

European Search Report dated Nov. 15, 1996.

P.D. Floyd et al., "Recent Results on ZnSe–Based Vertical––Cavity Surface Emitting Lasers Operating in the Blue", Phys. Stat. Sol., (b) 187, (1995) pp. 355–361 (No Month).

M. Nikaido et al., "30p–ZN–15 Fabrication of ZnSe nanoscale Cylinders by Low–Biased $Ch_4/H_2/O_2$–RIE", Extended Abstracts (The 42nd Spring Meeting, 1995); The Japan Society of Applied Physics and Related Societies, 1995, (w/partial English translation) (No Month).

K. Ohtsuka et al., "Electrical characterization of ZnSe epitaxial layer reactive–ion–etched by a gas mixture of ethane and hydrogen", J. Appl. Phys., vol. 75, No. 12, pp. 8231–8233, (June 1994).

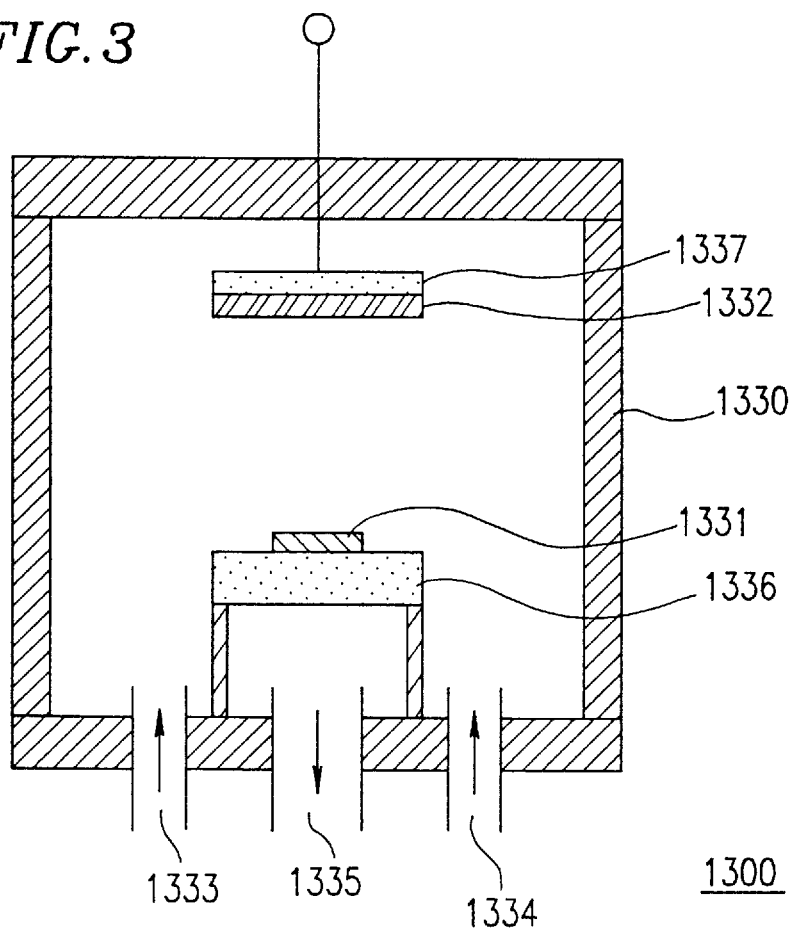

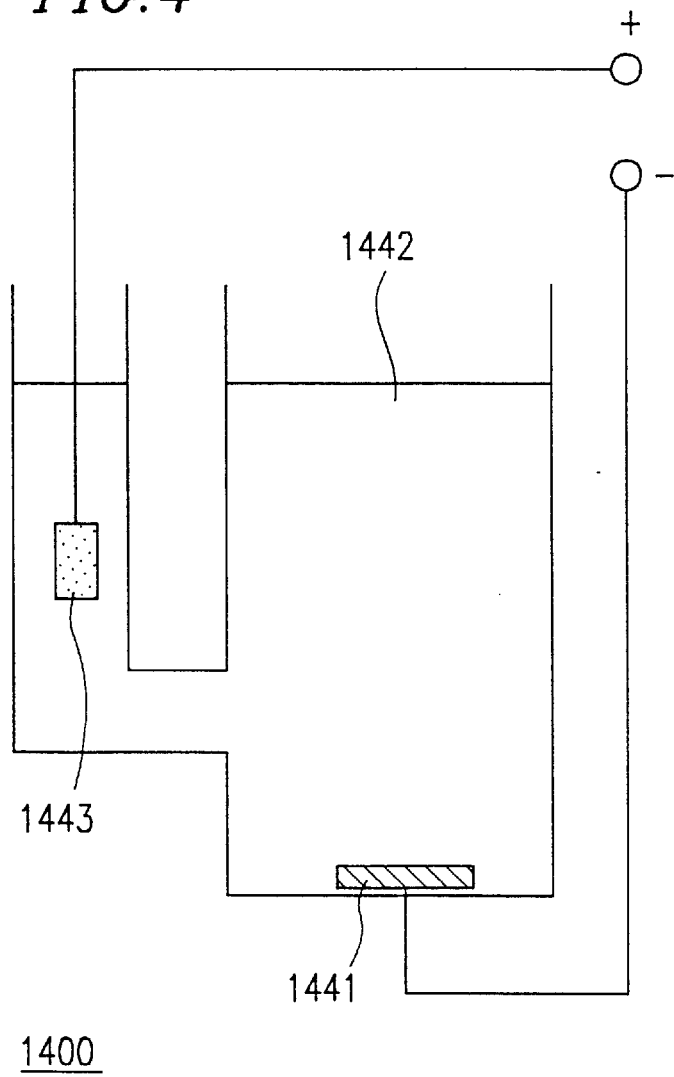

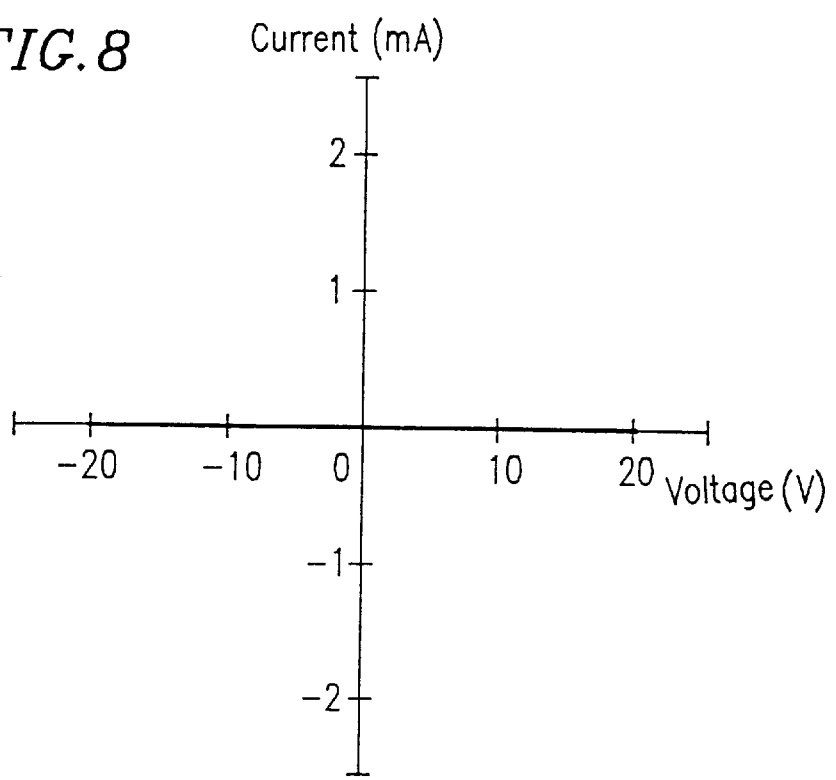

300

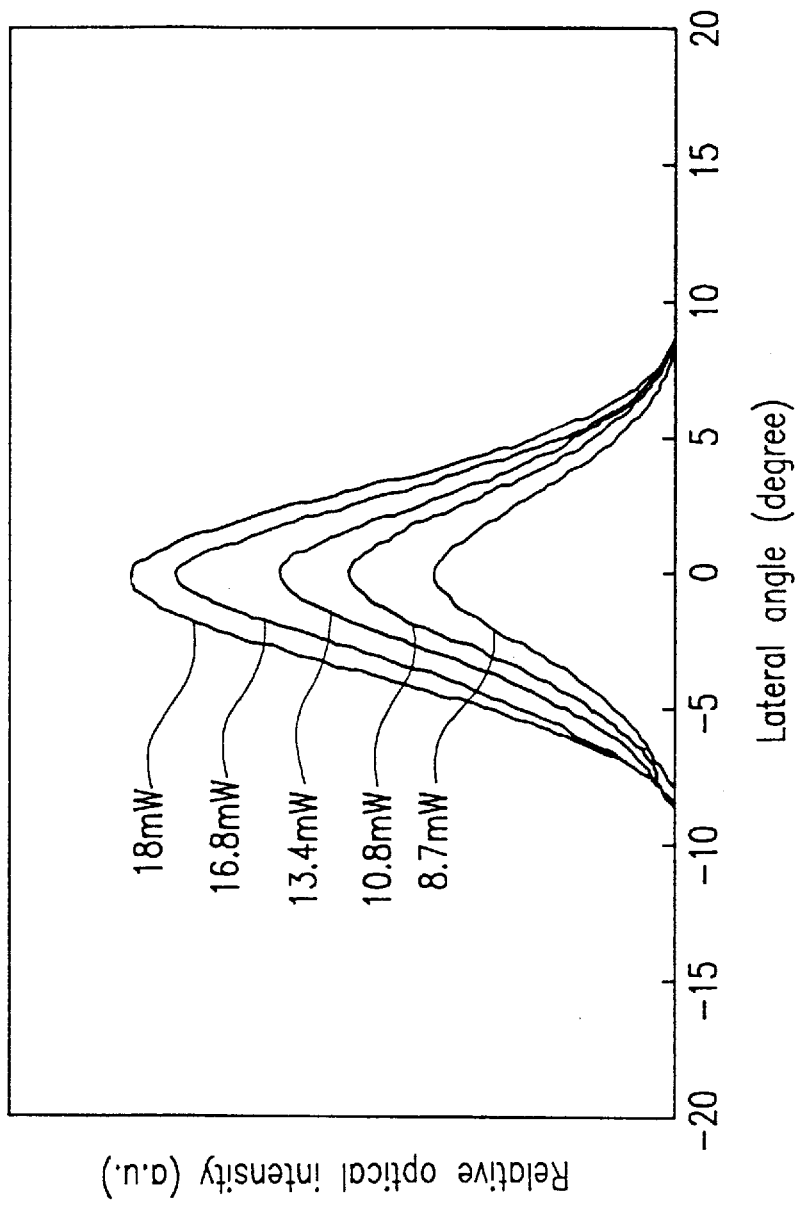

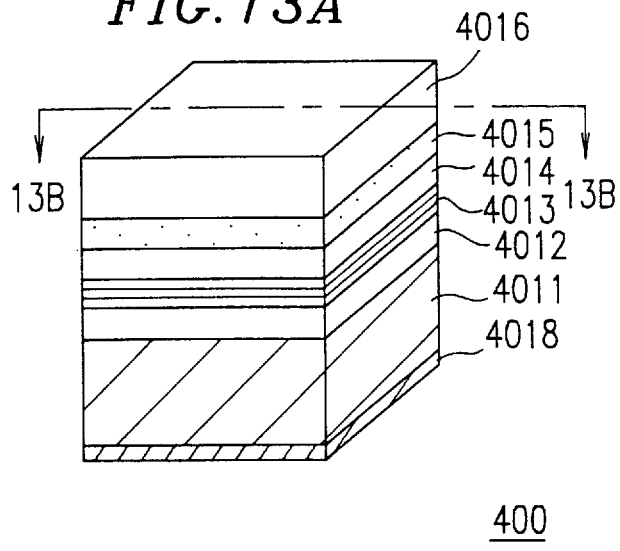
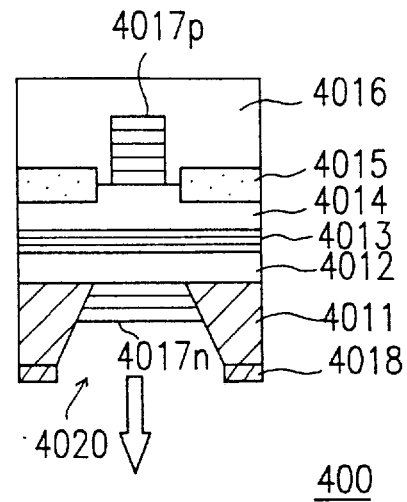
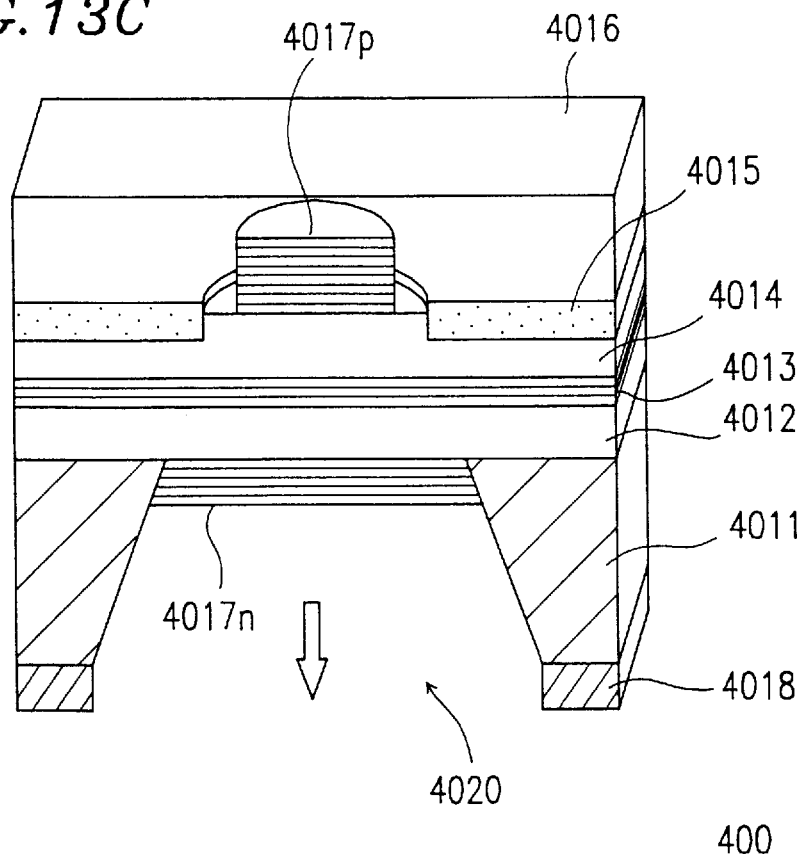
FIG. 13A
FIG. 13B
FIG. 13C

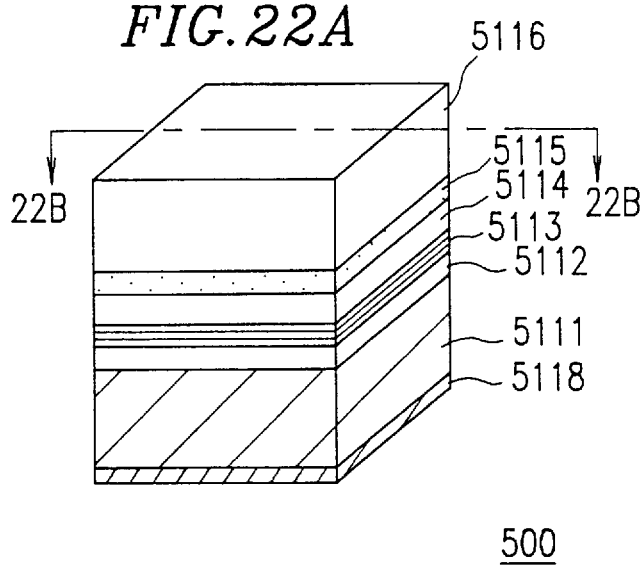
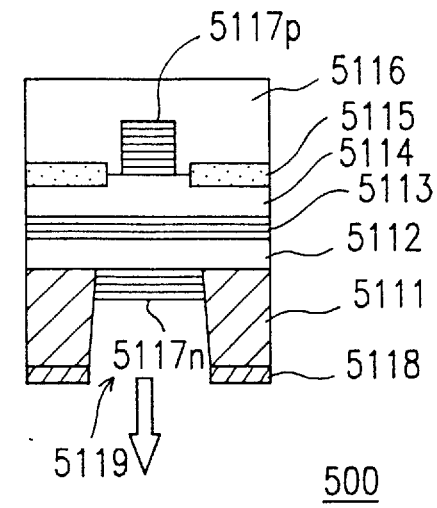
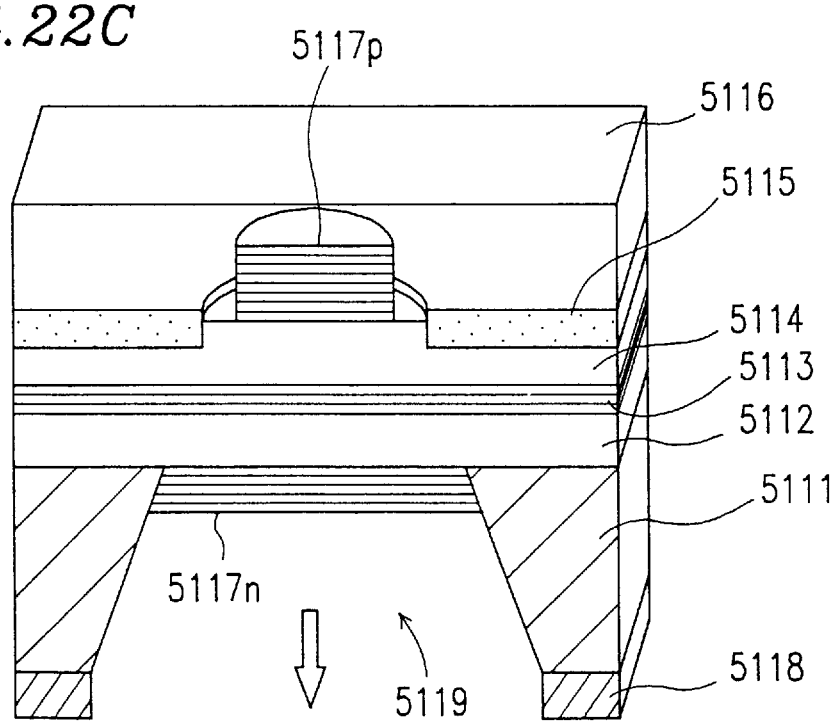

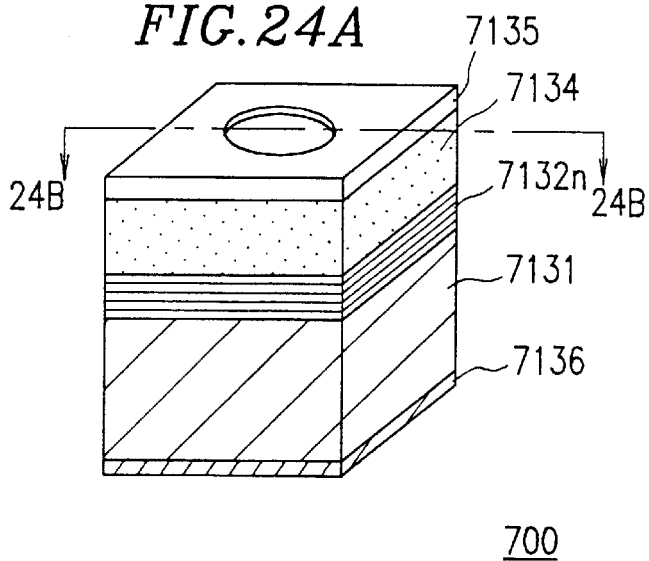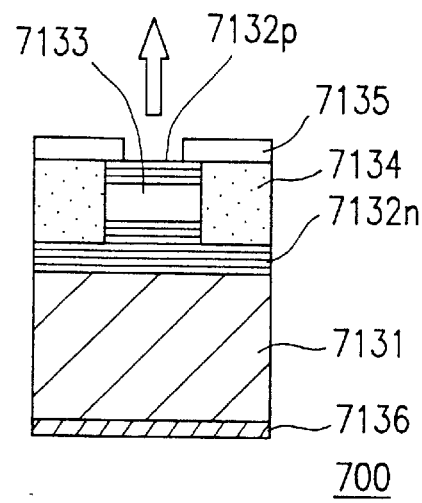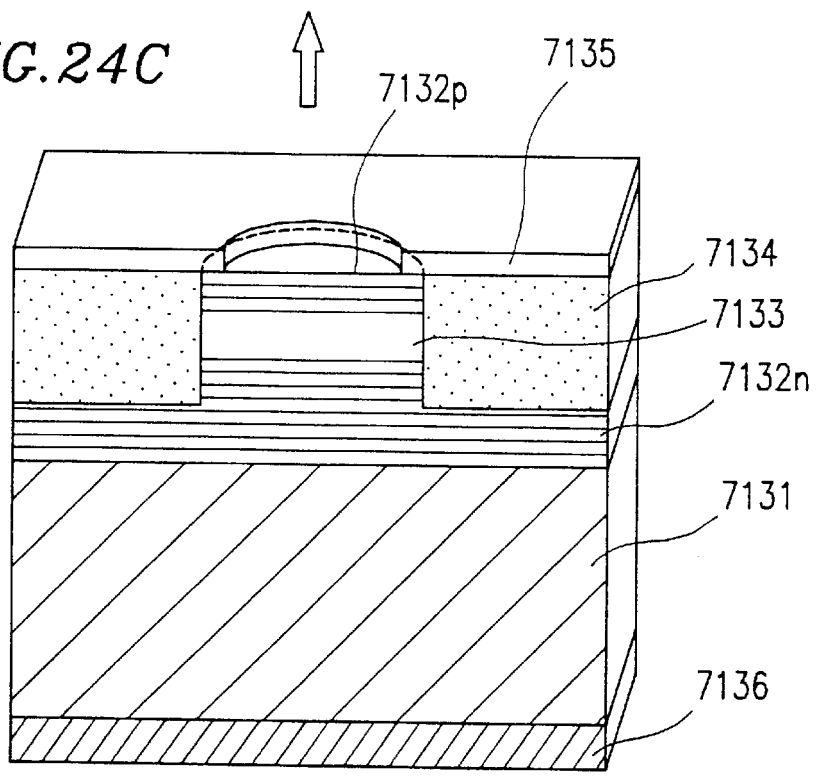

SEMICONDUCTOR LIGHT EMITTING DEVICE AND METHOD FOR FABRICATING THE SAME

BACKGROUND OF THE INVENTION

1. Field of the Invention

The present invention relates to a semiconductor light emitting device, such as a semiconductor laser and a light emitting diode, which is used in an optical disc apparatus, etc.

2. Description of the Related Art

Since a ZnSe series II–VI group compound semiconductor is a direct transition type semiconductor material which has a wide band gap, the development a semiconductor laser which emits blue laser light (referred to as a "blue semiconductor laser", hereinafter) employing this material is actively being conducted recently. FIG. 25 is a cross-sectional view illustrating an example of a structure for a conventional blue semiconductor laser 2500 using a ZnSe series II–VI group semiconductor material.

Specifically, the structure includes a Cl-doped n type ZnSe epitaxial layer 2502, a Cl-doped n type ZnMgSSe cladding layer 2503, a Cl-doped n type ZnSSe optical waveguide layer 2504, a ZnCdSe active layer 2505, an N-doped p type ZnSSe optical waveguide layer 2506, and an N-doped p type ZnMgSSe cladding layer 2507, which are deposited in this order on an Si-doped n type GaAs substrate 2501. The p type ZnMgSSe cladding layer 2507 is formed so that a portion thereof takes a stripe shape, and an N-doped p type ZnTe contact layer 2508 is formed on the stripe portion. On the other hand, on the portion of the p type ZnMgSSe cladding layer 2507 except the stripe portion is provided a polycrystalline $SiO_2$ burying layer 2509 so as to interpose the stripe portion therebetween. Furthermore, a p type AuPd electrode 2510 is provided on the p type ZnTe contact layer 2508 and the polycrystalline $SiO_2$ burying layer 2509. On the other hand, an n type In electrode 2511 is provided under the n type GaAs substrate 2501.

A conventional blue semiconductor laser 2500 having a structure such as the one described above has the following problems to be solved.

First, the polycrystalline $SiO_2$ burying layer 2509 used in the conventional blue semiconductor laser 2500 is formed by chemical vapor deposition or the like. However, the crystal growth temperature of a ZnSe series II–VI group compound semiconductor material is generally about 250° C., which is very low. Therefore, in order not to generate a crystal deterioration in the ZnSe series II–VI group compound semiconductor layer during the step of forming the polycrystalline $SiO_2$ burying layer 2509 which is conducted after the formation of a layer made of a ZnSe series II–VI group compound semiconductor material, the polycrystalline $SiO_2$ burying layer 2509 must be formed with a temperature lower than the growth temperature of the ZnSe series II–VI group compound semiconductor layer.

However, $SiO_2$ formed with such low temperature becomes porous polycrystalline. As a result, the adhesion to a ZnSe layer or the like becomes extremely poor so that peeling or the like easily occurs. Therefore, it is questionable to use $SiO_2$ as an insulating burying layer. Moreover, even in a case where the polycrystalline $SiO_2$ burying layer 2509 is used as a mask during etching, side etch is likely to occur due to the poor adhesiveness or the porous property, and it is not a valuable mask material.

Secondly, since the thermal conductivity of polycrystalline $SiO_2$ is considerably small, generated heat does not efficiently diffuse. As a result, the threshold value of the laser oscillation increases and the life of the light emitting device is shortened.

FIG. 26, on the other hand, is a cross-sectional view illustrating an example of a structure of a conventional vertical resonator type blue semiconductor laser 2600 using a ZnSe series II–VI group semiconductor material.

Specifically, the structure includes a Cl-doped n type ZnSe epitaxial layer 2602, a ZnCdSe active layer 2603, an n-doped p type ZnSe epitaxial layer 2604, and a multi-film reflecting mirror 2605 comprising a set of polycrystalline $SiO_2$ layers and polycrystalline SiN layers, which are deposited in this order on an Si-doped n type GaAs substrate 2601. An aperture of a predetermined shape is provided in the GaAs substrate 2601. Another multi-layer reflecting mirror 2605, which also comprises a set of polycrystalline $SiO_2$ layers and polycrystalline SiN layers, is provided on the n type ZnSe epitaxial layer 2602 exposed through the aperture.

Laser oscillation occurring in such structure by optical excitation is disclosed in, for example, P. D. Floyd, J. K. Furdyna, H. Luo, J. L. Merz, Y. Yamada, and T. Yokogawa, Proc. Int. Workshop on ZnSe-Based Blue-Green Laser Structures, Wurzburg, Germany, Sep. 18–23, 1994, p.77, Phys. Stat. Sol. (b) 187 (1995) 355. The oscillated laser light is emitted in the direction indicated by an arrow in FIG. 26, through the aperture of the GaAs substrate 2601 used as the "window".

A conventional blue semiconductor laser 2600 having a structure such as the one described above has the following problems to be solved.

First, in the conventional structure, the entire surface of the II–VI group semiconductor layer is covered with the multi-film reflecting mirrors 2605 formed of $SiO_2$ and SiN which are both insulators. For this reason, it is impossible that the current be injected through metal electrodes into the region of the active layer 2603 interposed by the multi-film reflecting mirrors 2605 and the path of the current be further constricted. As a result, a vertical resonator type blue semiconductor laser of a current driven type cannot be obtained.

Secondly, there is no etching method for a II–VI group semiconductor layer which can maintain high etching speed with little damage and, at the same time, has excellent verticality. Consequently, it is impossible to form a structure which can effectively constrict the current flow.

Thirdly, in the multi-film reflecting mirror 2605 constituted of the polycrystalline $SiO_2$ layer and the polycrystalline SiN layer, the difference between the refractive indices of $SiO_2$ and SiN is small and the absorption by the SiN is large for wavelengths in the blue region. Consequently, it is difficult to obtain high reflectivity.

Fourthly, in order to form the multi-film reflective mirrors 2605 constituted of the polycrystalline $SiO_2$ layer and the polycrystalline SiN layer on the Cl-doped n type ZnSe epitaxial layer 2602, a part of the GaAs substrate 2601 on the rear surface must be removed to form a window from which laser output is to be taken out. At the same time, the surface of the Cl-doped n type ZnSe epitaxial layer 2602 must be made to be extremely smooth so as not to introduce a decrease in the reflectivity. However, an etchant which has high etching speed for GaAs but, at the same time, has low etching speed for ZnSe, (i.e., an etchant with high selectivity for the both) is not available in conventional art. Thus, when a window is formed in the GaAs substrate 2601 by etching, the surface of the Cl-doped n type ZnSe epitaxial layer 2602 becomes rough. As a result, it introduces a decrease in the reflectivity.

Fifthly, it is difficult to form an electrode by a low temperature process on the n type GaAs substrate 2601 after a window from which laser light is to be emitted is formed in the GaAs substrate 2601.

SUMMARY OF THE INVENTION

According to one aspect of the invention, a semiconductor light emitting device includes: a II–VI group semiconductor epitaxial layer; and a ZnO layer provided on the II–VI group semiconductor epitaxial layer.

In one embodiment, the II–VI group semiconductor epitaxial layer is a laser structure.

According to another aspect of the invention, a semiconductor light emitting device includes: an active layer made of a II–VI group compound semiconductor; a first cladding layer and a second cladding layer respectively made of a II–VI group compound semiconductor which are formed so as to interpose the active layer therebetween; and a ZnO burying layer formed on the first cladding layer.

According to still another aspect of the invention, a semiconductor light emitting device includes: a substrate; and an n type cladding layer, an active layer, a p type cladding layer and a p type contact layer, respectively made of a II–VI group compound semiconductor, which are epitaxially grown in this order on the substrate, wherein the p type contact layer is formed in a stripe-shape, and a burying layer made of ZnO is further formed on both portions of the p type cladding layer which are located on both sides of the stripe-shaped p type contact layer.

According to still another aspect of the invention, a semiconductor light emitting device includes a II–VI group semiconductor epitaxial layer, wherein the II–VI group semiconductor epitaxial layer further includes a layer containing oxygen atoms at $1 \times 10^{14}$ cm$^{-3}$ or more.

In one embodiment, the II–VI group semiconductor epitaxial layer is a laser structure.

According to still another aspect of the invention, a method for fabricating a semiconductor light emitting device includes the step of forming a ZnO layer on a II–VI group semiconductor epitaxial layer by using a plasmarized oxygen.

According to still another aspect of the invention, a method for fabricating a semiconductor light emitting device includes the steps of: immersing a metal member and a II–VI group semiconductor member into a solvent containing an NO$_3$ compound; and applying a voltage between the metal member and the II–VI group semiconductor member by using the metal member as a positive electrode and the II–VI group semiconductor member as a negative electrode, thereby forming a ZnO layer on a surface of the II–VI group semiconductor member.

According to still another aspect of the invention, a method for fabricating a semiconductor light emitting device includes the steps of: epitaxially growing, on a substrate, an n type cladding layer, an active layer, a p type cladding layer and a p type contact layer in this order, respectively made of a II–VI group compound semiconductor; etching the p type contact layer into a striped shape; and forming a burying layer made of ZnO on both portions of the p type cladding layer which are located on both sides of the stripe-shaped p type contact layer.

In one embodiment, a plasmarized oxygen is used in the step of forming the burying layer.

In another embodiment, the step of forming the burying layer further includes the steps: immersing a metal member and a II–VI group semiconductor member into a solvent containing an NO$_3$ compound; and applying a voltage between the metal member and the II–VI group semiconductor member by using the metal member as a positive electrode and the II–VI group semiconductor member as a negative electrode, thereby forming a ZnO layer on a surface of the II–VI group semiconductor member.

According to still another aspect of the invention, a semiconductor light emitting device includes: an active layer made of a II–VI group compound semiconductor; an upper cladding layer and a lower cladding layer respectively made of a II–VI group compound semiconductor which are formed so as to interpose the active layer therebetween; and a burying layer formed on the upper cladding layer, an oxygen ion being implanted into the burying layer.

According to still another aspect of the invention, a semiconductor light emitting device includes: a substrate; and an n type cladding layer, an active layer, a p type cladding layer and a p type contact layer, respectively made of a II–VI group compound semiconductor, which are epitaxially grown in this order on the substrate, wherein the p type contact layer is formed in a stripe-shape, and a burying layer into which an oxygen ion is implanted is further formed on both portions of the p type cladding layer which are located on both sides of the stripe-shaped p type contact layer.

According to still another aspect of the invention, a method for fabricating a semiconductor light emitting device includes the step of implanting an oxygen ion into a predetermined region of a II–VI group semiconductor epitaxial layer to form a burying layer.

According to still another aspect of the invention, a method for fabricating a semiconductor light emitting device includes the steps of: epitaxially growing, on a substrate, an n type cladding layer, an active layer, a p type cladding layer and a p type contact layer in this order, respectively made of a II–VI group compound semiconductor; etching the p type contact layer into a striped shape; and implanting an oxygen ion into predetermined regions of the p type cladding layer which are located on both sides of the stripe-shaped p type contact layer to form a burying layer.

According to still another aspect of the invention, a vertical resonator type light emitting device includes a ZnO layer, formed on an epitaxial layer made of a II–VI group semiconductor material, for constricting current.

In one embodiment, the device further includes an electrode formed on the epitaxial layer in contact therewith in a ring-shape.

According to still another aspect of the invention, a vertical resonator type light emitting device comprising: an active layer; a p type epitaxial layer and an n type epitaxial layer respectively made of a II–VI group semiconductor material which are formed so as to interpose the active layer therebetween; and a ZnO layer formed on at least one of the p type epitaxial layer and the n type epitaxial layer, wherein a current is constricted by the ZnO layer.

In one embodiment, a mesa is formed on one of the p type epitaxial layer and the n type epitaxial layer which is formed on the active layer, and the ZnO layer is formed on both sides of the mesa.

In another embodiment, the device further includes an electrode formed on at least one of the p type epitaxial layer and the n type epitaxial layer in contact thereto in a ring-shape.

According to still another aspect of the invention, a vertical resonator type light emitting device includes: an active layer; a p type epitaxial layer and an n type epitaxial layer respectively made of a II–VI group semiconductor material which are formed so as to interpose the active layer therebetween; a ZnO layer, formed on at least one of the p type epitaxial layer and the n type epitaxial layer, for constricting a current; a reflecting mirror, formed in a region surrounded with the ZnO layer, for reflecting light; and an electrode being in contact, in a ring-shape, with the epitaxial layer disposed between the reflecting mirror and the ZnO layer.

In one embodiment, the reflecting mirror is a layered structure of $TiO_2$ and $SiO_2$.

In another embodiment, a layered structure including the p type epitaxial layer, the n type epitaxial layer and the ZnO layer is formed on a GaAs substrate, and the device further comprises an electrode made of Au, Ge and Ni, which is in contact with the GaAs substrate.

According to still another aspect of the invention, a vertical resonator type light emitting device includes: a semiconductor substrate having an aperture of a predetermined shape; a first epitaxial layer formed on the semiconductor substrate; an active layer formed on the first epitaxial layer; a second epitaxial layer formed on the active layer; a ZnO layer, buried on both sides of a mesa which is formed in the second epitaxial layer, for constricting current; a first reflecting mirror formed on the second epitaxial layer so as to be surrounded with the ZnO layer; and a second reflecting mirror formed on a portion of a surface of the first epitaxial layer which is exposed through the aperture of the semiconductor substrate.

In one embodiment, the device further includes: a first electrode formed on a portion of the first epitaxial layer which is interposed between the ZnO layer and the first reflecting mirror; and a second electrode formed on a surface of the semiconductor substrate.

In another embodiment, the semiconductor substrate is a GaAs substrate and the device further comprises an electrode made of Au, Ge and NI, which is in contact with the GaAs substrate.

In still another embodiment, each of the first and second reflecting mirrors is a layered structure of $TiO_2$ and $SiO_2$.

According to still another aspect of the invention, a method for fabricating a vertical resonator type light emitting device includes the step of dry-etching a layer made of a II–VI group semiconductor material using a gas which contains $CH_4$, $H_2$ and Xe as main components.

According to still another aspect of the invention, a method for fabricating a vertical resonator type light emitting device includes the steps of: growing a first epitaxial layer, an active layer and a second epitaxial layer, respectively made of a II–VI group semiconductor material; and dry-etching the second epitaxial layer using a gas which contains $CH_4$, $H_2$ and Xe as main components.

In one embodiment, the method further includes the step of burying a ZnO layer on both sides of the mesa. Preferably, the method further includes the step of forming a multilayered film constituted with a $TiO_2$ layer and a $SiO_2$ layer in a region surrounded with the ZnO layer using a plasmarized oxygen.

In another embodiment, a layered structure including the first epitaxial layer, the active layer and the second epitaxial layer is formed on a GaAs substrate, and the method further comprises the step of etching the GaAs substrate with a mixed solution of $NH_4OH$, $H_2O_2$ and $H_2O$ to form a window from which an optical output is taken out.

According to still another aspect of the invention, the method for fabricating a vertical resonator type light emitting device includes the step of forming a layer of a material selected from the group consisting of ZnO, $TiO_2$ and $SiO_2$ on an epitaxial layer made of a II–VI group semiconductor material using a plasmarized oxygen.

According to still another aspect of the invention, the method for fabricating a vertical resonator type light emitting device includes the step of etching a GaAs substrate with a mixed solution containing $NH_4OH$, $H_2O_2$ and $H_2O$ as main components.

Thus, the invention described herein makes possible the advantages of (1) providing a semiconductor light emitting device in which a burying layer is formed from a material having a low refractivity suitable for providing light confinement as well as a high thermal conductivity, which is formed on epitaxial layers in the II–VI group compound semiconductor laser structure with high adhesiveness, as well as a method for fabricating the same, and (2) providing a vertical resonator type semiconductor light emitting device having a current constricting structure and emitting light with a low threshold current, as well as a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 3 is a cross-sectional view illustrating an apparatus for fabricating a ZnO layer in which plasmarized oxygen is utilized.

FIG. 4 is a cross-sectional view illustrating an electrochemical apparatus for fabricating a ZnO layer.

FIG. 8 is a graph showing current vs. voltage characteristics of the burying layer (into which oxygen is ion-implanted) in the blue semiconductor laser shown in FIG. 5.

FIG. 10 is a graph showing a lateral far-field pattern for the blue semiconductor laser shown in FIG. 9A.

FIG. 13A is an isometric view illustrating a vertical resonator type blue semiconductor laser in accordance with a fourth embodiment of the present invention, FIG. 13B is a cross-sectional view taken along line 13B—13B in FIG. 13A, and FIG. 13C is a view three-dimensionally illustrating the cross-sectional view shown in FIG. 13B.

FIG. 22A is an isometric view illustrating a vertical resonator type blue semiconductor laser in accordance with a fifth embodiment of the present invention, FIG. 22B is a cross-sectional view taken along line 22B—22B in FIG. 22A, and FIG. 22C is a view three-dimensionally illustrating the cross-sectional view shown in FIG. 22B.

FIG. 24A is an isometric view illustrating a vertical resonator type blue semiconductor laser in accordance with a seventh embodiment of the present invention, FIG. 24B is a cross-sectional view taken along line 24B—24B in FIG. 24A, and FIG. 24C is a view three-dimensionally illustrating the cross-sectional view shown in FIG. 24B.

DESCRIPTION OF THE PREFERRED EMBODIMENTS

EXAMPLE 1

A first embodiment of the present invention will be described with reference to the figures.

Figure 1:
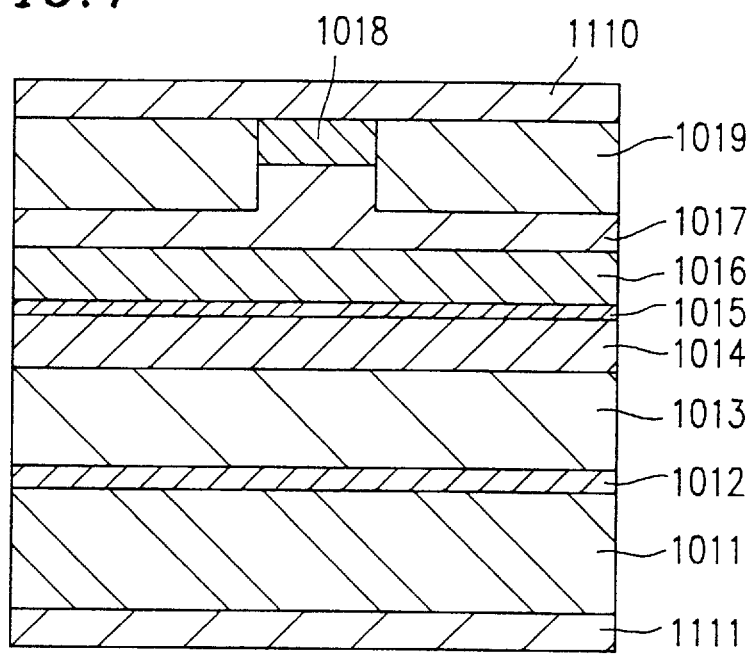
FIG. 1 is a cross-sectional view of a blue semiconductor laser in accordance with a first embodiment of the present invention.

FIG. 1 is a cross-sectional view illustrating the structure of a blue semiconductor laser 100 using ZnSe series II–VI group semiconductor according to the first embodiment of the present invention.

In the semiconductor laser 100, a Cl-doped n type ZnSe epitaxial layer 1012 (0.03 $\mu$m thickness), a Cl-doped n type ZnMgSSe cladding layer 1013 ($Zn_{0.9}Mg_{0.1}S_{0.1}Se_{0.9}$, 1.0 $\mu$m thickness), a Cl-doped n type ZnSSe optical waveguide layer 1014 ($ZnS_{0.06}Se_{0.94}$, 0.12 $\mu$m thickness), a ZnCdSe active layer 1015 ($Zn_{0.8}Cd_{0.2}Se$, 0.006 $\mu$m thickness), and an N-doped p type ZnSSe optical waveguide layer 1016 ($ZnS_{0.06}Se_{0.94}$, 0.12 $\mu$m thickness) are deposited in this order on an Si-doped n type GaAs substrate 1011.

On the p type ZnSSe optical waveguide layer 1016 is formed a p type ZnMgSSe cladding layer 1017 such that a part thereof has a stripe shape, and an N-doped p type ZnTe contact layer 1018 is formed on the stripe portion. On the other hand, on the portion of the p type ZnMgSSe cladding layer 1017 except the stripe portion is provided a polycrystalline ZnO burying layer 1019 so as to interpose the stripe portion therebetween. Furthermore, a p type AuPd electrode 1110 is provided on the p type ZnTe contact layer 1018 and the polycrystalline ZnO burying layer 1019. An n type In electrode 1111 is provided, on the other hand, under the n type GaAs substrate 1011.

Among respective layers deposited as described above, the n type ZnSe epitaxial layer 1012 does not lattice-match with the GaAs substrate 1011, but functions as a buffer layer between the GaAs substrate 1011 and the upper structure constituted of the II–VI group semiconductor materials. On the other hand, the n type ZnMgSSe cladding layer 1013 and the n type ZnSSe optical waveguide layer 1014, which are deposited on the n type ZnSe epitaxial layer 1012, lattice-match with the GaAs substrate 1011. Moreover, the ZnCdSe active layer 1015 deposited on the n type ZnSSe optical waveguide layer 1014 does not lattice-match with the GaAs substrate 1011, but since its thickness is as thin as 0.006 $\mu$m, which is lower than the critical film thickness, dislocation due to lattice mismatch does not occur.

As described above, in the semiconductor laser 100 of the present embodiment, the burying layer 1019 made of polycrystalline ZnO is provided which has roles of current constriction and light confinement. Because of good thermal radiation of the ZnO, the reduction of the threshold current density and the long life of the device can be realized. Moreover, due to effective light confinement, single transverse mode laser oscillation can be obtained.

Although the burying layer 1019 is constituted of the polycrystalline ZnO in the present embodiment, it can be constituted of monocrystalline ZnO to obtain a similar effect.

Furthermore, ZnO is used as a material for the burying layer 1019 in the above description, polycrystalline ZnS can be used as a material for the burying layer 1019. However, the polycrystalline ZnS has high water absorption and is likely to undergo degradation due to water absorption. Furthermore, since it is brittle in terms of material strength, its adhesiveness to ZnSe or the like is poor. Therefore, it cannot be said that it is a highly valuable material for an insulating burying layer or an etching mask. Contrary to this, as in the present embodiment described above, by constituting the burying layer 1019 using ZnO, the burying layer 1019 which has low water absorption rate and has excellent adhesiveness to II–VI group compound semiconductor materials can be obtained, and a semiconductor laser with a low threshold value can be realized.

Next, an example of the production steps of the semiconductor laser 100 in the present embodiment will be described with reference to FIGS. 2A to 2E. In the production steps in the present embodiment to be described hereinafter, molecular beam epitaxy is used as a growth method of ZnSe series II–VI group semiconductor materials.

Figure 2A:
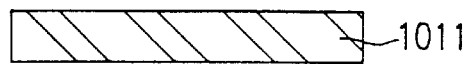
FIGS. 2A through 2E are cross-sectional views illustrating fabricating steps of the blue semiconductor laser shown in FIG. 1.
Figure 2B:
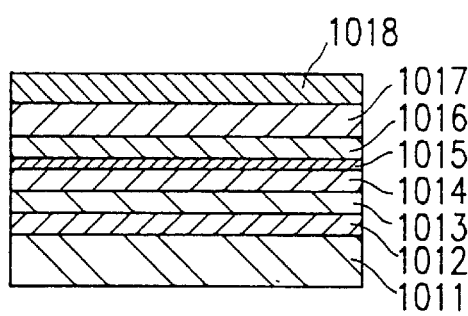

First, as shown in FIG. 2A, an n type GaAs substrate 1011 is prepared. Then, as shown in FIG. 2B, a Cl-doped n type ZnSe epitaxial layer 1012, a Cl-doped n type ZnMgSSE cladding layer 1013, a Cl-doped n type ZnSSe optical waveguide layer 1014, a ZnCdSe active layer 1015, an N-doped p type ZnSSe optical waveguide layer 1016, an N-doped p type ZnMgSSe cladding layer 1017, and an N-doped p type ZeTe contact layer 1018 are successively epitaxially grown on the GaAs substrate 1011.

Figure 2C:
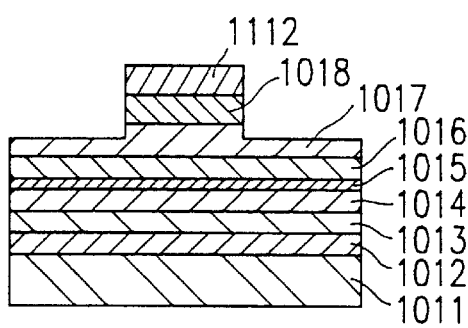
Figure 2D:
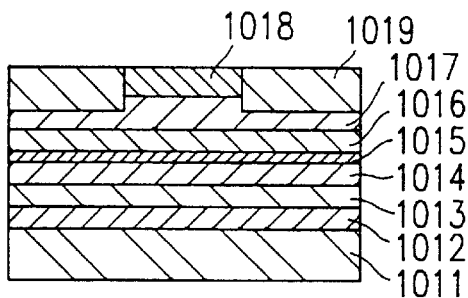

Next, a pattern for a resist 1112 of stripe shape is formed by photolithography on the grown layers, specifically on the p type ZnTe contact layer 1018 which is the uppermost layer. Then, by using the pattern as a mask, the grown layers are etched into a stripe shape. Specifically speaking, as shown in FIG. 2C, regions of the N-doped p type ZnMgSSe cladding layer 1017 and the N-doped p type ZnTe contact layer 1018 which are not covered with the resist mask 1112 are etched using a saturated bromine solution. The etchant is a mixed solution of the ratio of saturated bromine solution:phosphoric acid:water=1:2:3.

Figure 2E:
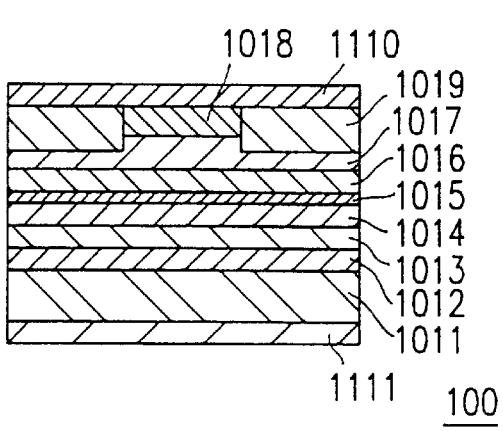

Next, a ZnO layer 1019 is formed on the entire surface of the wafer by sputtering at a room temperature. After the formation of the ZnO layer 1019, the resist layer 1112 and portion of the ZnO layer deposited on the resist layer 1112 are removed with lift-off by acetone (see FIG. 2D). Thereafter, a p type AuPd electrode 1110 is formed over the entire upper surface of the wafer using vapor deposition as shown in FIG. 2E. Furthermore, an n type In electrode 1111 is deposited on the lower surface of the GaAs substrate 1011 also by vapor deposition. This completes the formation of the semiconductor laser 100.

In the above description, sputtering is used for the formation of the ZnO layer. In order to increase the deposit speed of the ZnO layer even when the process temperature is sufficiently low, it is effective to introduce oxygen in plasma form to the sputtering apparatus. FIG. 3 is a schematic view of the apparatus 1300 to be used when the ZnO layer is formed using oxygen in plasma form.

In the construction shown in FIG. 3, a II–VI group semiconductor material wafer 1331 is disposed on an electrode 1336 provided within a vacuum chamber 1330. Moreover, a ZnO target 1332 is disposed on another electrode 1337 so as to oppose to the wafer 1331. Furthermore, an argon gas supply tube 1333, oxygen gas supply tube 1334, and an exhaust system 1335 are provided to the vacuum chamber 1330.

Specifically, while maintaining the ZnO target 1332 at negative voltage with respect to the wafer 1331, the discharge gas introduced in the vacuum chamber 1330, for example the Ar gas, is depressurized to initiate the electrical discharge. The Ar ions are, thereby, accelerated toward and bombarded on the Zno target 1332 which is being maintained at the negative voltage. The ZnO which is detached from the target 1332 due to this bombardment is deposited on the II–VI group semiconductor wafer (substrate) 1331 located nearby.

In the construction of the apparatus 1300 illustrated in FIG. 3, while the Ar gas is introduced into the vacuum chamber 1330 through the Ar gas supply tube 1333, oxygen is simultaneously introduced into the vacuum chamber 1330 through the oxygen gas supply tube 1334. The oxygen which becomes plasmarized due to the electrical discharges is taken into the ZnO film deposited on the II–VI group semiconductor substrate 1331. This prevents the oxygen from being missed in the ZnO film to be deposited, thereby obtaining a high quality ZnO film. Furthermore, even at a low process temperature, the deposit rate is several times faster than in a depositing method of the conventional art.

Although sputtering is used to form the ZnO film in the production method of the first embodiment of the present invention described thereabove, it is effective as well to electrochemically oxidize the II–VI group semiconductor substrate to obtain the ZnO film.

FIG. 4 is a schematic view of an apparatus 1400 used for the electrochemical formation of a ZnO film.

A II–VI group semiconductor wafer (substrate) 1441 and an electrode 1443 are doused in an electrolytic solution 1442. As the electrolytic solution, a solvent such as ethylene glycol or N-methyl acetamid added with salt such as $KNO_3$ or $NH_4NO_3$ is used. With the II–VI group semiconductor substrate 1441 being the negative electrode and the electrode 1443, made of metal such as platinum, being the positive electrode, voltage is applied between the electrodes 1441 and 1443 to oxidize the surface of the semiconductor substrate 1441.

The mechanism of this oxidation is that the Zn ion detached from the boundary between the ZnSe and ZnO is transported and diffused within the ZnO film due to the electric field, and reacts with the oxygen on the surface of the oxide film. The growth rate of the oxide film is almost proportional to the density of the current flowing through the circuit. In a case of oxidation with a constant current, the voltage between the electrodes 1441 and 1443 gradually rises and insulation breakdown of the ZnO film occurs. Therefore, there is a limit to the thickness to be grown. Typically, about 200 nm is the limit.

By this method, a high quality ZnO film can be formed at room temperature without inflicting damage to the II–VI group semiconductor substrate 1441.

EXAMPLE 2

Hereinafter, a second embodiment of the present invention will be described with reference to the figures.

Figure 5:
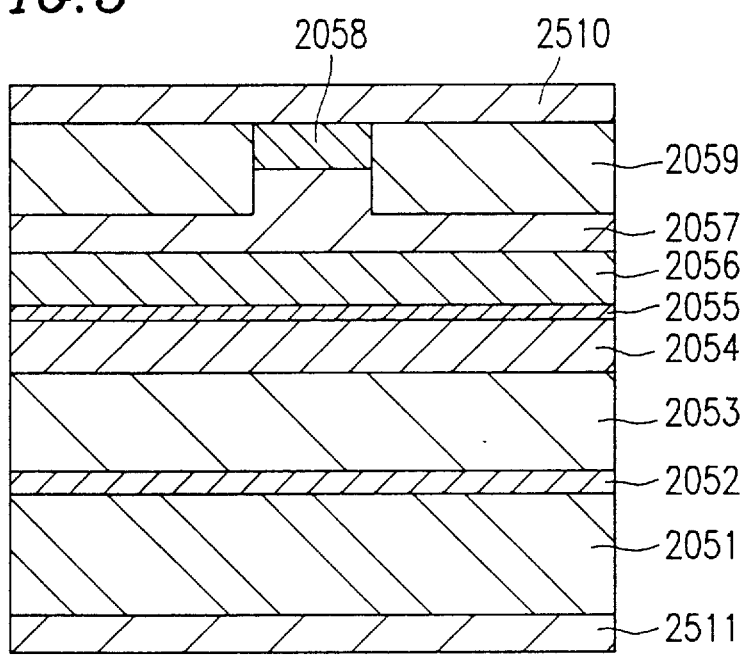
FIG. 5 is a cross-sectional view of a blue semiconductor laser in accordance with a second embodiment of the present invention.

FIG. 5 is a cross-sectional view illustrating the structure of a blue semiconductor laser 200 of the present embodiment using a ZnSe series II–VI group semiconductor.

In the semiconductor laser 200, a Cl-doped n type ZnSe epitaxial layer 2052, a Cl-doped n type ZnMgSSe cladding layer 2053, a Cl-doped n type ZnSSe optical waveguide layer 2054, a ZnCdSe active layer 2055, an N-doped p type ZnSSe optical waveguide layer 2056, and an N-doped p type ZnMgSSe cladding layer 2057 are deposited in this order on an Si-doped n type GaAs substrate 2051.

The p type ZnMgSSe cladding layer 2057 is formed so that a part thereof has a stripe shape, and an N-doped p type ZnTe contact layer 2058 is formed on the stripe portion. On the part of the p type ZnMgSSe cladding layer 2057 except the stripe portion, on the other hand, is formed a burying layer 2059 which is ion-implanted with oxygen so as to interpose the stripe portion therebetween. Furthermore, a p type AuPd electrode 2510 is provided on the p type ZnTe contact layer 2058 and the burying layer 2059. On the other hand, an n type In electrode 2511 is provided under the n type GaAs substrate 2051.

As described above, in the semiconductor laser 200 of the present embodiment, a layer 2059 which is ion-implanted with oxygen is provided as the burying layer, which plays the role of constricting the current and confining the light. Since such a layer has a good thermal radiation, the reduction of the threshold current density and the long life of the device can be realized.

Moreover, a difference in refractivity in a preferred range with respect to the cladding layer 2057 is achieved, as in the case of the ZnO burying layer of the first embodiment. Thus, an effective light confinement is realized, and stable single transverse mode laser oscillation can be obtained.

Figure 6:
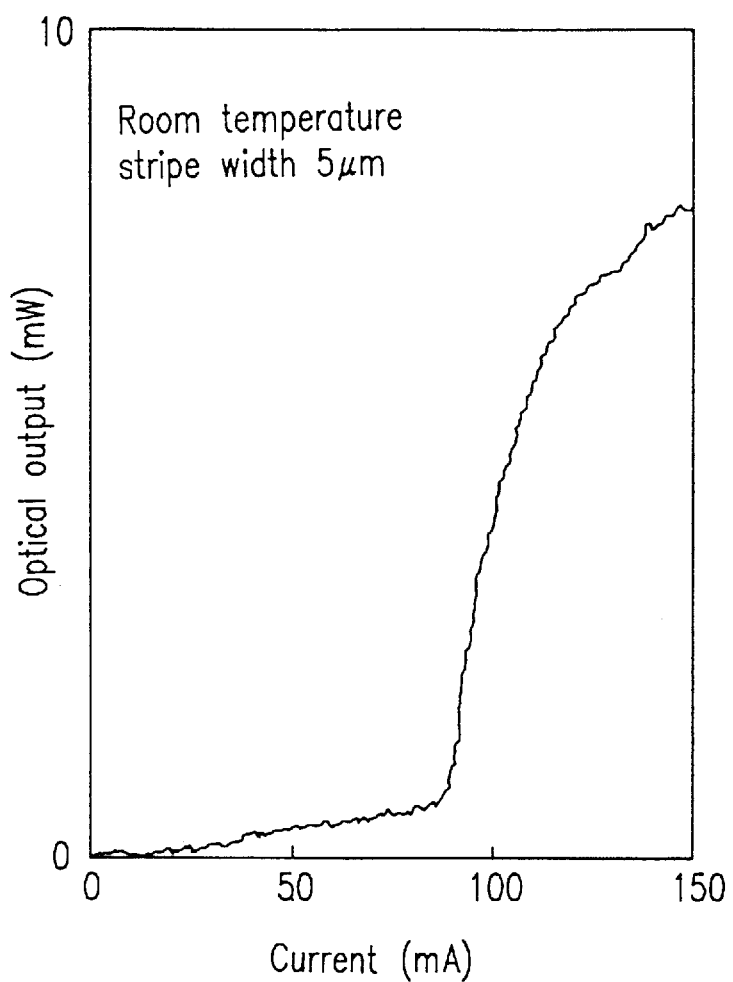
FIG. 6 is a graph showing current vs. optical output characteristics of the blue semiconductor laser shown in FIG. 5.

In the semiconductor laser 200 of the present structure, a continual oscillation at room temperature is realized at a wavelength of about 500 nm. FIG. 6 is a graph illustrating current-optical output characteristics of the semiconductor laser 200, obtained when continuously oscillated at room temperature with the cladding layer 2057 having a 5 $\mu$m wide stripe.

Next, an example of production steps of the semiconductor laser 200 in the present embodiment will be described with reference to FIGS. 7A through 7D. In the production steps of the present embodiment to be described below, molecular beam epitaxy is used as a growth method for ZnSe series II–VI group semiconductor materials.

Figure 7A:
FIGS. 7A through 7D are cross-sectional views illustrating fabricating steps of the blue semiconductor laser shown in FIG. 5.
Figure 7B:
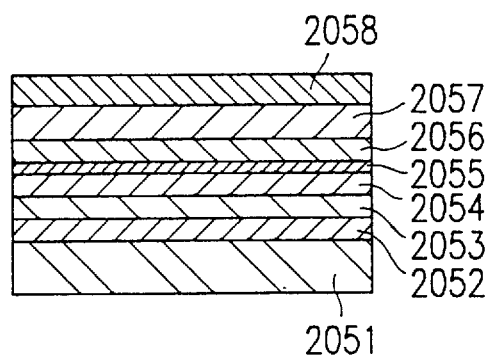

First, as shown in FIG. 7A, an n type GaAs substrate 2051 is prepared. Then, as shown in FIG. 7B, a Cl-doped n type ZnSe epitaxial layer 2052, a Cl-doped n type ZnMgSSe cladding layer 2053, a Cl-doped n type ZnSSe optical waveguide layer 2054, a ZnCdSe active layer 2055, an N-doped p type ZnSSe optical waveguide layer 2056, an N-doped p type ZnMgSSe cladding layer 2057, and an N-doped p type ZnTe contact layer 2058 are epitaxially grown in this order on the GaAs substrate 2051.

Figure 7C:
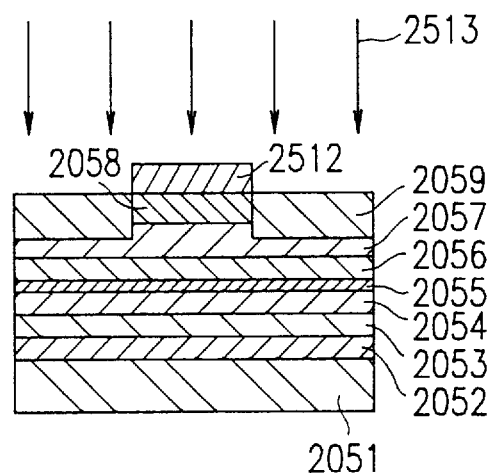

Next, a pattern of a resist 2512 of stripe shape is formed by photolithography on the grown layers, specifically on the p type ZnTe contact layer 2058 which is the uppermost layer, and using the pattern as a mask, oxygen ions are implanted to the grown layers as shown in FIG. 7C.

Figure 7D:
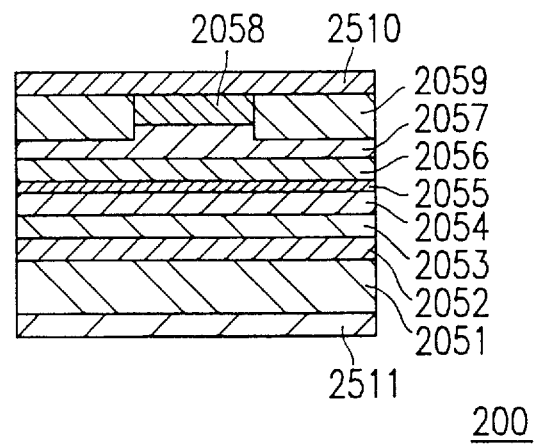

Thereafter, the resist layer 2512 is removed using lift-off by acetone (see FIG. 7D). And then, a p type AuPd electrode 2510 is formed on the entire upper surface of the wafer by vapor deposition as shown in FIG. 7D. Furthermore, then, an n type In electrode 2511 is deposited on the rear surface side of the GaAs substrate 2051 also by vapor deposition. This completes the formation of the semiconductor laser 200.

Conditions for the ion implantation are, for example, set for the acceleration voltage of 90 V and the dosage of $1 \times 10^{13}$ cm$^{-2}$. In this case, the range calculated from LSS theory is $R_p = 0.14$ $\mu$m. As a result, oxygen ions 2513 are implanted into portions of the p type ZnMgSSe cladding layer 2057 and the p type ZnTe contact layer 2058 which are not covered by the resist 2512, thereby forming the implanted layer 2059.

When oxygen is ion-implanted into a ZnSe series II–VI group semiconductor, it is preferable that the dosage be between $5 \times 10^{12}$ cm$^{-2}$ and $1 \times 10^{14}$ cm$^{-2}$. The dosage in this range provides concentration of the implanted oxygen impurities of $1 \times 10^{14}$ cm$^{-3}$ or more to a region of a thickness of $2R_p$ (0.28 $\mu$m). Thus, the region obtains a high resistivity to be highly insulative. For a dosage exceeding this range, the influence of the irradiation damage deficiency on an active layer, characteristic to II–VI group materials, becomes large and it becomes difficult to obtain laser oscillation. For a dosage not reaching this range, it becomes difficult to obtain high resistivity and therefore a ZnSe series II–VI group semiconductor cannot be used as an insulating burying layer.

FIG. 8 illustrates current-voltage characteristics in the layer 2059 to which oxygen is ion-implanted in an attempt to show that the layer 2059 is insulative. From the figure, it can be seen that current does not flow at all when voltages in the range from −20 V to +20 V are applied to the layer 2059, thereby exhibiting effective insulation. Although a heat treatment at 275° C. is conducted for ten minutes after the ion implantation in the present embodiment, this can possibly be omitted depending on the dosage.

EXAMPLE 3

In a blue-green semiconductor laser, the realization of small astigmatism and stable fundamental transverse mode oscillation is required for the application to high density optical disk memories and laser printers. Index guiding effect in a buried ridge structure is effective to realize such characteristics. A real index-guided blue-green semiconductor laser which decreases beam astigmatism by using a ZnO burying layer and realizes stable transverse mode oscillation will be described as a third embodiment of the present invention.

Figure 9A:
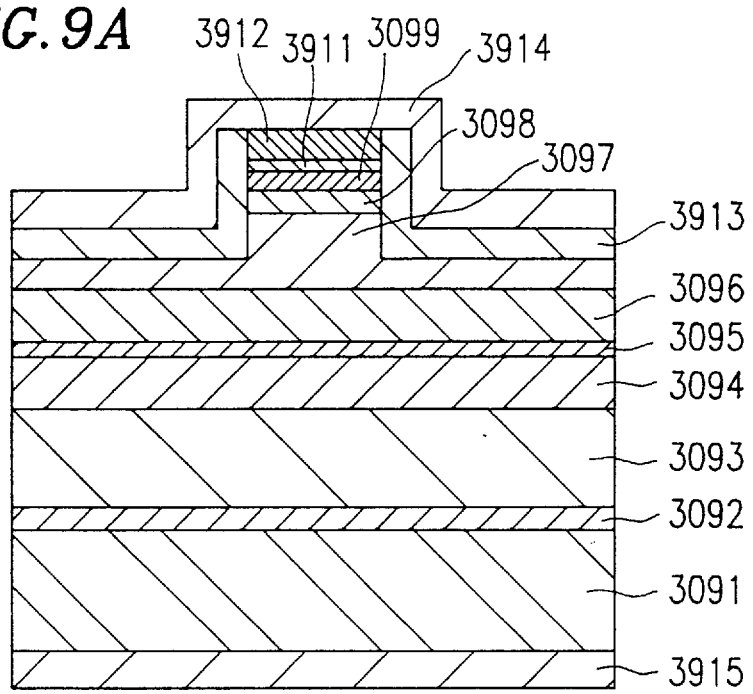
FIG. 9A is a cross-sectional view of a blue semiconductor laser in accordance with a third embodiment of the present invention.

FIG. 9A is a cross-sectional view illustrating the structure of a ZnCdSe/ZnSSe/ZnMgSSe SCH index-guided laser 300 of the present embodiment.

In the semiconductor laser 300, a Cl-doped n type ZnSe epitaxial layer 3092 (0.01 $\mu$m thickness), a Cl-doped n type ZnMgSSe cladding layer 3093 ($Zn_{0.9}Mg_{0.1}S_{0.1}Se_{0.9}$, 2.0 $\mu$m thickness), a Cl-doped n type ZnSSe optical waveguide layer 3094 ($ZnS_{0.06}Se_{0.94}$, 0.11 $\mu$m), a ZnCdSe active layer 3095 ($Zn_{0.8}Cd_{0.2}Se$, 0.006 $\mu$m), and an N-doped p type ZnSSe optical waveguide layer 3096 ($ZnS_{0.06}Se_{0.94}$, 0.12 $\mu$m thickness) are deposited in this order on an Si-doped n type GaAs substrate 3091.

The p type ZnMgSSe cladding layer 3097 is formed such that a part thereof has a stripe shape. The thickness of in the strip-shaped region is about 0.74 $\mu$m, and that in the other region is about 0.23 $\mu$m. An N-doped p type ZnTe contact layer 3912 is formed above the stripe portion with the inclusion therebetween of deposited layers of a p type ZnSSe layer 3098 ($ZnS_{0.06}Se_{0.94}$, 0.45 $\mu$m) which lattice-matches to the GaAs substrate 3091, a p type ZnSe layer 3099, and a multiquantum well layer 3911 which is made of p type ZnTe and p type ZeSe. On the other hand, a ZnO burying layer 3913 is provided both on the part of the p type ZnMgSSe cladding layer 3097 except the stripe portion and on the side of the stripe portion. Furthermore, a p type AuPd electrode 3914 is provided on the p type ZnTe contact layer 3912 and the polycrystalline ZnO burying layer 3913. On the other hand, an n type In electrode 3915 is provided under the n type GaAs substrate 3091.

Among the respective layers deposited as described above, the n type ZnSe epitaxial layer 3092 does not lattice-match with the GaAs substrate 3091 but functions as a buffer layer between the GaAs substrate 3091 and the upper structure constituted of the II–VI group semiconductor materials. On the other hand, the n type ZnMgSSe cladding layer 3093 and the n type ZnSSe optical waveguide layer 3094 which are deposited on the n type ZnSe epitaxial layer 3092 lattice-match with the GaAs substrate 3091. Moreover, the ZnCdSe active layer 3095 deposited on the n type ZnSSe optical waveguide layer 3094 does not lattice-match with the GaAs substrate 3091, but since its thickness is as thin as 0.006 $\mu$m, which is lower than the critical film thickness, the dislocation due to lattice mismatch does not occur.

Figure 9B:
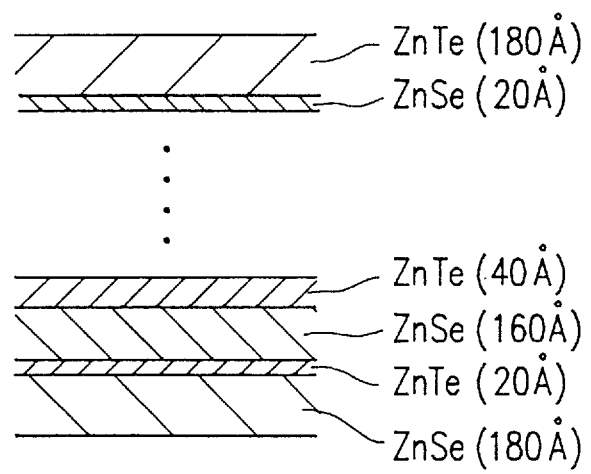
FIG. 9B is an enlarged cross-sectional view illustrating a multi quantum-well layer in the blue semiconductor laser shown in FIG. 9A.

Furthermore, the p type ZnSSe layer 3098 on the p type ZnMgSSe cladding layer is inserted in order to ease a sudden change in band off-set between the p type ZnMgSSe layer 3097 and the p type ZnSe layer 3099. Moreover, the multiquantum well layer 3911 includes ZnSe layers and ZnTe layers which are alternately deposited as illustrated in FIG. 9B, so that the composition of the multiquantum well layer 3911 changes gradually between the underlying ZnSe layer 3099 and the overlying ZeTe layer 3912.

As described above, in the semiconductor laser 300 of the present embodiment, the burying layer 3913 made of ZnO, whose refractive index is about 2.2, is provided, which plays the role of constricting the current and confining the light. Since ZnO has good thermal radiation, the reduction of the threshold current density and the long life of the device can be realized. Moreover, due to an effective light confinement, stable single transverse mode laser oscillation can be obtained.

The epitaxial growth of each of the above-mentioned layers is conducted at a growth temperature of about 270° C. Moreover, the ridged waveguide structure is formed by using a load-locked electron cyclotron resonance (ECR) plasma etching system. The laser structure is formed by using the electrical discharge of $Cl_2$ gas and $H_2$ gas. Due to the anisotropic characteristics of the ECR plasma etching, the side wall of the ridge portion can be formed vertical and the surface thereof can be made smooth, thereby forming a ridge pattern with high precision.

The characteristics of the semiconductor laser 300 of the present embodiment under pulsed operation at a room temperature will be described as follows. Typically, the light output versus current characteristics is kink-free to greater than 200 mA. The threshold current is about 200 mA.

Furthermore, the result of the investigation of the far-field pattern of the lasing mode will be described as follows. FIG. 10 illustrates the lateral far-field pattern of the laser with a 5-$\mu$m-wide ridge.

From the figure, it can be seen that, even if the injection current is changed over a wide range to change the optical output power, the output beam is anastigmatic and has a constant far-field full angle. This indicates that a real index guiding mode in the lateral direction is achieved. Furthermore, the constant shape in the lateral direction for the various injected currents implies that single lateral mode oscillation is achieved up to 18 mW of the output. The lateral far-field radiation angle is as narrow as 7° above the threshold.

Figure 11:
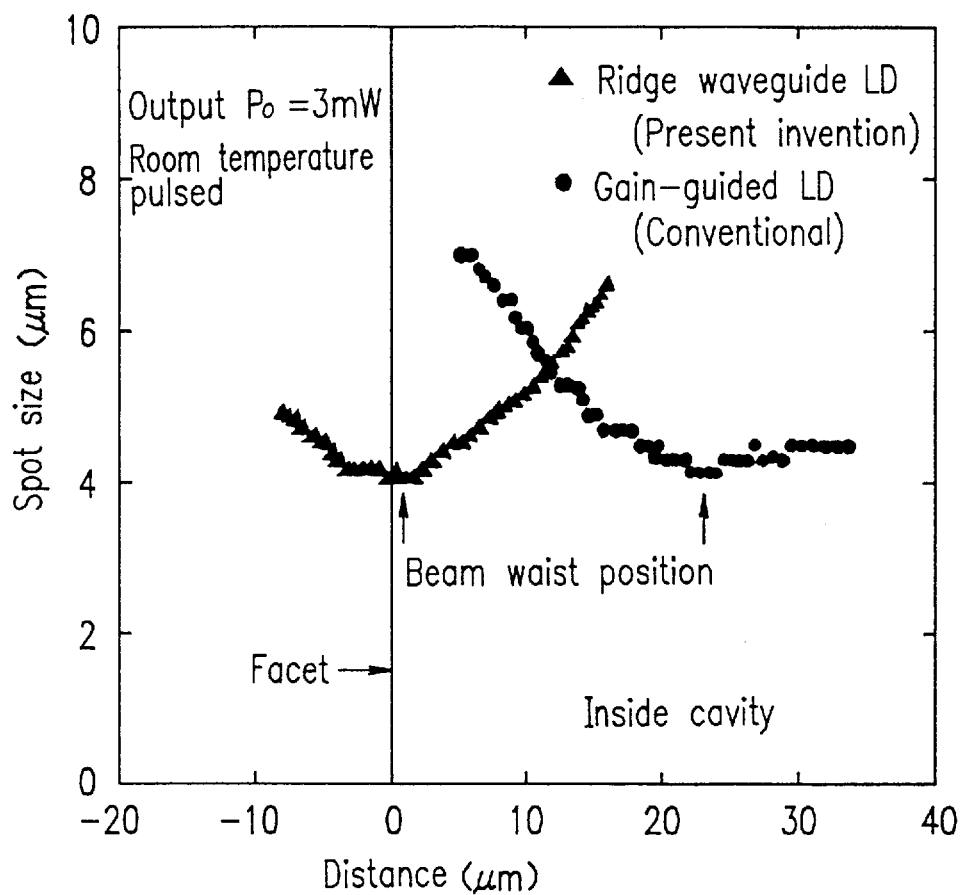
FIG. 11 is a graph showing a laser spot size in the vicinity of the laser mirror facet of the blue semiconductor laser shown in FIG. 9A, measured in a plane parallel to the junction plane at an output of 3 mW.

FIG. 11 shows a laser spot size in the vicinity of the laser mirror facet measured in a plane parallel to the junction plane at an output of 3 mW.

Figure 12A:
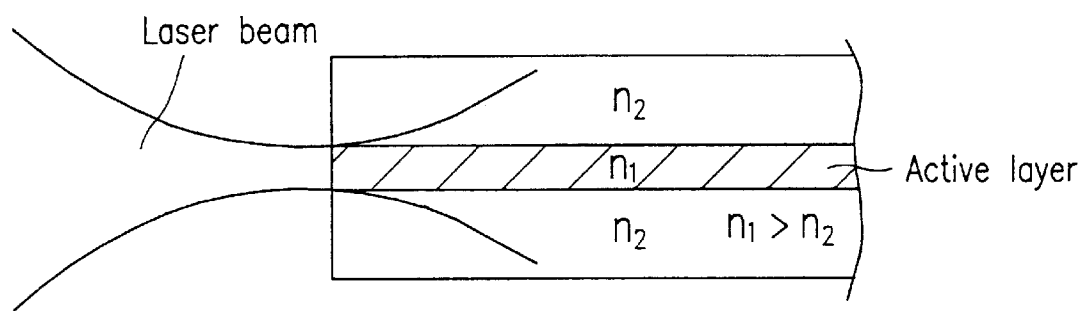
FIG. 12A is a view schematically illustrating a shape for the laser beam waist in the blue semiconductor laser shown in FIG. 9A viewed from the side thereof.
Figure 12B:
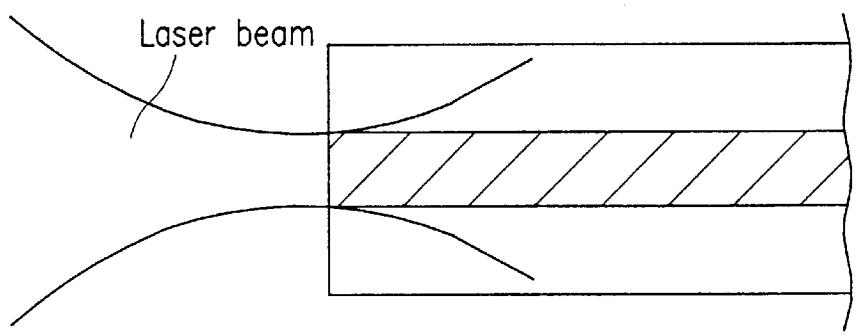
FIG. 12B is a view schematically illustrating a shape for the laser beam waist in the blue semiconductor laser shown in FIG. 9A viewed from the top thereof.

Generally, the distance between the laser waist (i.e., the portion which has the least laser spot diameter) and the laser mirror facet is called the astigmatism. As illustrated in FIG. 11, although the astigmatism of a semiconductor laser having a structure of the conventional art is about 25 $\mu$m, the astigmatism in the present embodiment is 0.5 $\mu$m or lower due to the real index guiding structure. Therefore, according to the present embodiment, as illustrated in FIGS. 12A and 12B, the beam waist is located at the laser mirror facet whether it is viewed from the side (FIG. 12A) or from the top (FIG. 12B). This makes it possible to minimize the beam spot diameter when stopping the lens.

In the semiconductor lasers described in the above respective embodiments, the stripe of the cladding layer typically has a width of about 5 $\mu$m.

Although an example of a ZnSe series II–VI group semiconductor laser is illustrated in the above description of the present embodiment, it goes without saying that the present invention can be applied to a ZnS series II–VI group semiconductor laser.

As described above, in the first, second, and third embodiments of the present invention, the ZnO layer is formed on the II–VI group semiconductor epitaxial structure included in the blue semiconductor laser structure to be used as the insulating burying layer. This ZnO layer can be formed, for example, by using oxygen in plasma form. Alternatively, the ZnO layer can be formed on the surface of a II–VI group semiconductor member by immersing a metal member and the II–VI group semiconductor member in a solvent containing an $NO_3$ compound and applying voltage between the two members, the metal member being a positive electrode and the II–VI group semiconductor member being a negative electrode.

Alternatively, according to the present invention, a layer containing oxygen of $1\times10^{14}$ cm$^{-3}$ or more can be formed in the II–VI group semiconductor epitaxial structure included in the blue semiconductor laser structure to be used as the insulating burying layer. In this case, oxygen can be added by using accelerated oxygen ions.

The Zno layer used as a material for the insulating burying layer in the present invention is one of several II–VI group compound semiconductor materials, and has extremely excellent adhesiveness for materials such as ZnSe, ZnSSe, and ZnMgSSe. It also has excellent anti-acid and anti-oxidation properties. Furthermore, it has almost zero water absorption property and excels in the stability of shape and dimensions.

Moreover, ZnO has an extremely good thermal conductive property and its thermal conductivity is almost 30 times as large as that of $SiO_2$. Therefore, by using ZnO as the insulating burying layer, heat generated in the active layer efficiently diffuses through the ZnO insulating burying layer.

Furthermore, ZnO has a smaller refractive index compared with ZnSe, ZnSSe, ZnMgSSe, etc., and the difference therebetween is in the preferable range.

Specifically, the refractive index of the cladding layer is typically about 2.5 to 2.6, while that of the ZnO layer constituting the insulating burying layer is typically about 2.2. When the difference of refractive index between the cladding layer and the insulating burying layer is in such a range, stable single transverse mode laser oscillation is achieved even with a cladding layer having a striped portion with a enlarged width as large as 5 to 10 $\mu$m. Contrary to the above, the conventional $SiO_2$ insulating burying layer typically has a refractive index of about 1.4, resulting in a large difference with respect to the refractive index of the cladding layer. As a result, in order to achieve a stable single transverse mode laser oscillation, the width of the stripe in the cladding layer has to be reduced to about 2 $\mu$m. it is, however, difficult to fabricate the stripe with such a small width.

Thus, the ZnO insulating burying layer effectively functions as a light confinement layer in the lateral direction.

As described above, in the first through third embodiments of the present invention, a ZnO layer, or a ZnSe series semiconductor layer added with oxygen, is used as the burying layer of the semiconductor laser. This improves the adhesiveness of the burying layer for the ZnSe series semiconductor layer and the thermal diffusion. For this reason, a low threshold current density, long life, high power, high temperature operation, etc., which could not be realized conventionally, can be obtained in a ZnSe series blue semiconductor laser, and its industrial value is extremely high.

EXAMPLE 4

A fourth embodiment of the present invention will be described with reference to the figures.

FIGS. 13A, 13B, and 13C illustrate the structure of a vertical resonator type blue semiconductor laser 400 using a ZnSe series II–VI group semiconductor according to the present invention. Specifically, FIG. 13A is an isometric view illustrating the appearance of the semiconductor laser 400, FIG. 13B is cross-sectional view taken along the line 13B—13B in FIG. 13A, and FIG. 13C expresses the cross-section shown in FIG. 13B three-dimensionally.

In the semiconductor laser 400, a Cl-doped n type ZnSe epitaxial layer (cladding layer) 4012, a multiquantum well layer 4013 which is constituted of ZnCdSe well layers and ZnSe barrier layers and functions as an active layer, and an N-doped p type ZnSe epitaxial layer (cladding layer) 4014 are deposited in this order on an Si-doped n type GaAs substrate 4011. Disposed on both sides of the p type ZnSe epitaxial layer 4014 is a polycrystalline ZnO burying layer 4015 to constrict current. Multifilm reflecting mirrors 4017p and 4017n are formed on the p type ZnSe epitaxial layer 4014 and on the surface of the n type ZnSe layer 4012 exposed by etching a part of GaAs substrate 4011, respectively, and they functions as reflecting mirrors for obtaining laser oscillation. Furthermore, a p type AuPd electrode 4016 is formed on the ZnO burying layer 4015 so as to cover the reflecting mirror 4017p, and on the other hand, an n type AuGeNi electrode 4018 is provided on the rear surface of the n type GaAs substrate 4011.

In FIG. 13A, the reflecting mirror 4017p is invisible as it is covered with the electrode 4016. The reflecting mirror 4017n is also invisible in FIG. 13A which is formed at the location corresponding to the bottom of an aperture (window) 4020 formed at the center of the GaAs substrate 4011. From FIG. 13C, it can be seen that the reflecting mirror 4017p is cylindrical in shape.

When voltage of 20 V is applied between the p type electrode 4016 and the n type electrode 4018 of this semiconductor laser 400, the current injected through the p type electrode 4016 does not flow through the portion of the ZnO burying layer 4015. That is, the current is constricted and flows into the multiquantum well layer 4013 through the ring-shaped area between the ZnO burying layer 4015 and the reflecting mirror 4017p, thereby generating light.

The generated light is reflected by the upper/lower reflecting mirrors 4017p and 4017n. The reflecting mirror 4017p has high reflectivity due to a large number of layers being deposited. Typically, the reflectivity of the reflecting mirror 4017p is 99%. On the other hand, the reflectivity of the reflecting mirror 4017n is typically 95%. Therefore, laser light is emitted from the side of the reflecting mirror 4017n, as illustrated by an arrow.

Next, production steps of the semiconductor laser 400 will be described with reference to FIGS. 14A to 14E. Molecular beam epitaxy is used as a growth method of a ZnSe series II–VI group semiconductor material in the present embodiment.

First, a Cl-doped n type ZnSe epitaxial layer 4012, a multiquantum well layer 4013 constituted of ZnCdSe well layers and ZnSe barrier layers, and an N-doped p type ZnSe epitaxial layer 4014 are epitaxially grown in this order on an Si-doped n type GaAs substrate 4011. In FIGS. 14A to 14E, however, boundaries among the GaAs substrate 4011, the n type ZnSe epitaxial layer 4012, and the multiquantum well layer 4013 are not drawn for simplification.

Next, processes for the upper surface side of the semiconductor laser 400 will be described as follows.

Figure 14A:
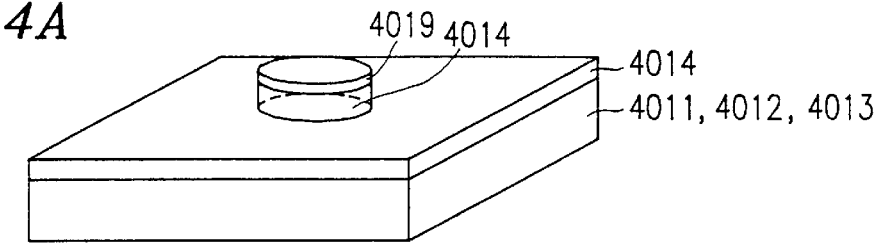
FIGS. 14A through 14E are cross-sectional views illustrating fabricating steps of the blue semiconductor laser shown in FIGS. 13A through 13C.

A resist pattern 4019 of a cylindrical shape (16 $\mu$m diameter) is formed on the N-doped p type ZnSe epitaxial layer 4014 by photolithography. Then the N-doped p type ZnSe epitaxial layer 4014 is etched using the resist pattern 4019 as a mask. By doing so, as shown in FIG. 14A, the thickness of a region of the p type ZnSe epitaxial layer 4014 which is covered with the resist pattern 4019 is maintained while the thickness of other regions thereof is reduced.

Figure 14B:
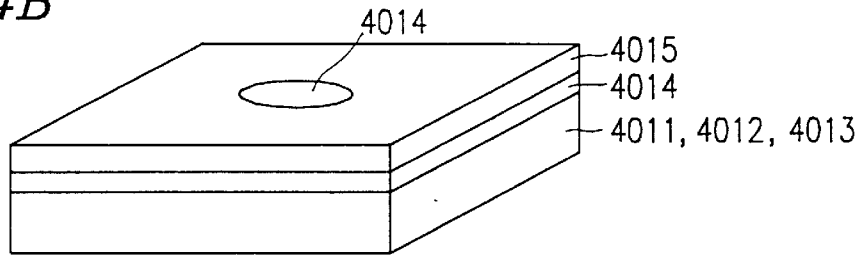

Thereafter, a polycrystalline ZnO burying layer 4015 is deposited by sputtering on the region of the p type ZnSe epitaxial layer 4014 whose thickness has been reduced. Furthermore, by conducting lift-off, a polycrystalline ZnO burying structure for current constriction is produced as shown in FIG. 14B.

Figure 14C:
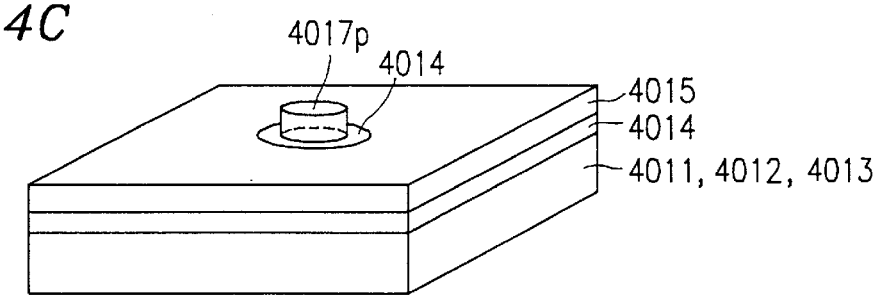
Figure 14D:
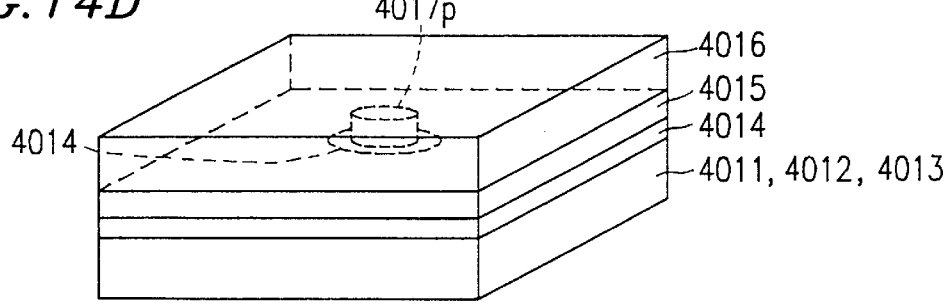
Figure 14E:
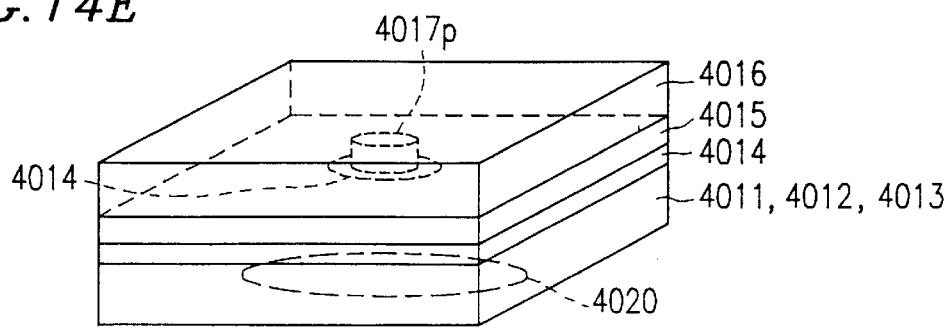

Next, a resist pattern to be a window (12 $\mu$m diameter) for forming a multifilm reflecting mirror 4017p is formed by photolithography, and the multifilm constituted of polycrystalline $SiO_2$ layers and polycrystalline $TiO_2$ layers is deposited thereon by sputtering. Lift-off is, then, conducted to form the multifilm reflecting mirror 4017p of a cylindrical shape of a diameter of 12 $\mu$m on the upper surface side of the semiconductor laser 400 as shown in FIG. 14C.

Next, a p type AuPd electrode 4016 is formed on the N-doped p type ZnSe epitaxial layer 4014. Specifically, a Pd layer of 10 nm thickness is deposited over the entire surface of the p type ZnSe epitaxial layer 4014, and an Au layer of 200 nm thickness is deposited thereon. By doing this, the p type electrode structure in which the AuPd electrode 4016 makes contact with the N-doped p type ZnSe epitaxial layer 4014 in the ring-shaped area can be produced.

Next, processes on the rear surface side of the semiconductor laser 400 will be described.

First, in order to facilitate the photolithographic process, the In sticking to the Si-doped n type GaAs substrate 4011 is removed by etching by using an HCl solution. Next, an alloy layer remaining on the exposed surface is removed by grinding, and the GaAs substrate 4011 is further etched until the thickness thereof becomes 140 $\mu$m using a mixed solution whose mixing ratio is $H_2SO_4:H_2O_2:H_2O=1:8:1$.

Next, the GaAs substrate 4011 is further etched and a window of 30 $\mu$m diameter is opened to expose the n type ZnSe epitaxial layer 4012. This is the region where the multifilm reflecting mirror 4017n to be formed on the rear surface of the semiconductor laser 400 makes contact, and the process is conducted considering the fact that the GaAs substrate 4011 is not transparent to wavelengths of the color blue. Specifically, a resist pattern is formed by photolithography and, then, the GaAs substrate 4011 is etched by using a mixed solution as an etchant whose mixing ratio is $NH_4OH:H_2O_2:H_2O=3:66:20$ to open a window of a desired shape and size. Since the etching rate of the above-mentioned etchant for GaAs is 20 times larger as that of the same etchant for ZnSe, the etching halts when all GaAs is etched off and the ZnSe is exposed. By doing this, an extremely flat ZnSe surface can be exposed. Furthermore, with the prescribed window 4020 provided in the GaAs substrate 4011, the multifilm constituted of polycrystalline $SiO_2$ layers and polycrystalline $TiO_2$ layers is deposited, by sputtering, on the GaAs substrate 4011 as well as on the n type ZnSe epitaxial layer 4012 exposed at the bottom of the window 4020. Lift-off is then conducted and the multifilm reflecting mirror 4017n (see FIGS. 13B and 13C), which is to be an emitting window of laser light on the rear surface side of the semiconductor laser 400, is produced.

The composition of the etchant which can be used in the present embodiment is not limited to the above described values. Specifically, provided that $NH_4OH$ is in the range of 2 to 5, $H_2O_2$ is in the range of 30 to 70, and $H_2O$ is in the range of 10 to 40, the similar effect can be obtained.

Furthermore, the area of the multifilm reflecting mirror 4017n is again covered with a resist pattern by photolithography and, then, an Ni film of 5 nm thickness, a Ge film of 20 nm thickness, an Au film of 30 nm thickness, a Ge film of 20 nm thickness, an Au film of 60 nm thickness, an Ni film of 40 nm thickness, and an Au film of 100 nm thickness are deposited thereon in this order. Lift-off is finally used to produce an n type AuGeNi electrode 4018. The heat treatment temperature then is typically 230° C.

Although a multifilm of Ni/Ge/Au is used in the present embodiment for forming the n type AuGeNi electrode 4018, if the thickness of the Ni film as the first layer is set in the range of 5 to 20 nm, then the direct deposition of an AuGe alloy thereon yield the similar effect.

Figure 15:
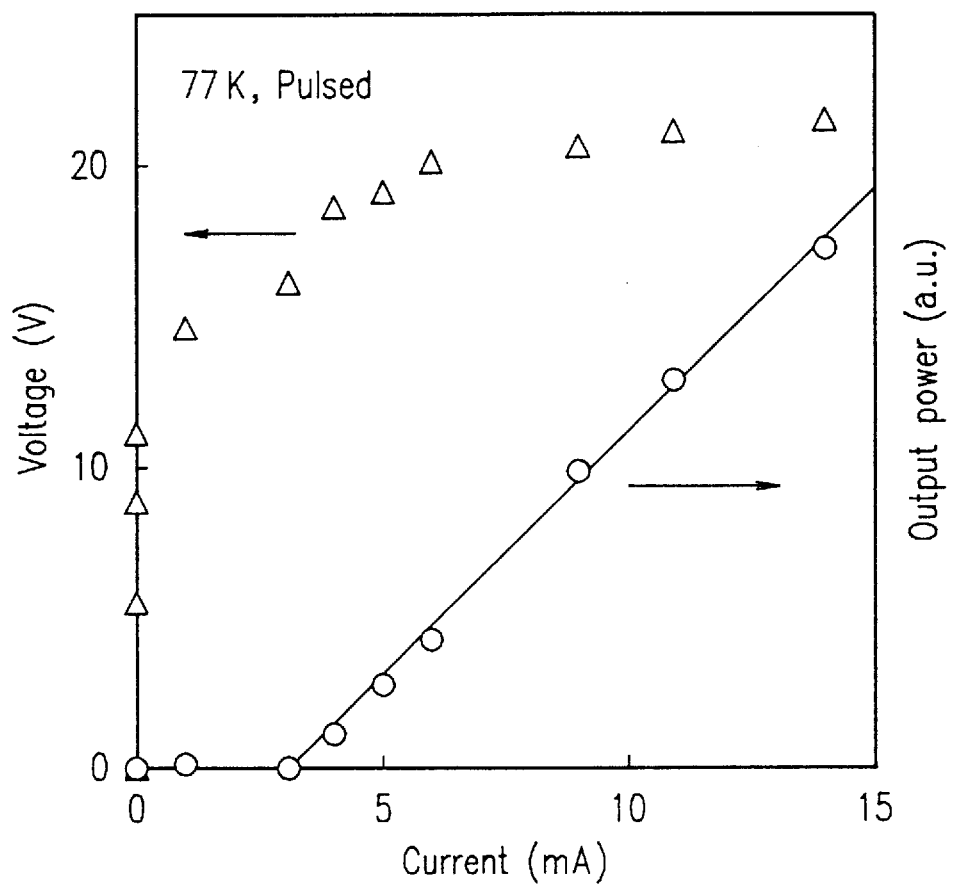
FIG. 15 are graphs showing current vs. laser output characteristic and current vs. voltage characteristic of the blue semiconductor laser shown in FIGS. 13A through 13C.

FIG. 15 is a graph illustrating the current versus laser output characteristics and the current versus voltage characteristics of the vertical resonator type blue semiconductor laser 400 of the present embodiment. Specifically, it shows the measured results obtained during a pulsed operation at the liquid nitrogen temperature (77K).

From the figure, the current value at which laser output rises, i.e., the threshold current is about 3 mA, and extremely small threshold current is being obtained.

Figure 16:
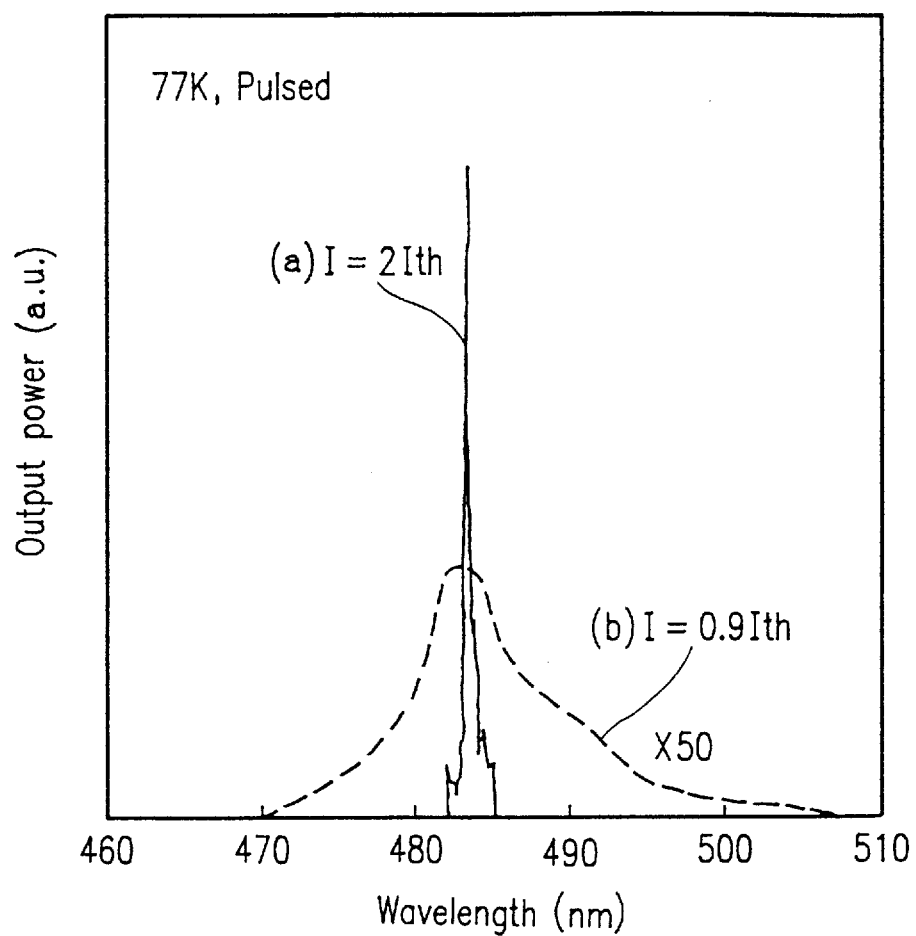
FIG. 16 is a graph showing a spectrum obtained from the blue semiconductor laser shown in FIGS. 13A through 13C.

FIG. 16 shows a spectrum of the emitted light from the vertical resonator type blue semiconductor laser 400 of the present embodiment. Specifically, it shows the measured results obtained during a pulsed operation at the liquid nitrogen temperature (77K). The solid line (a) represents a spectrum when the drive current takes the value which is twice the threshold current $I_{th}$ and the dotted line (b) is a spectrum when the drive current takes a value which is 0.9 times the threshold current $I_{th}$.

From the figure, it can be confirmed that in (b) where the drive current is below the threshold current, broad naturally-emitted light is observed but, in (a) where the drive current is above the threshold current, a sharply peaked spectral line is obtained, indicating that a laser oscillation is being obtained. The laser oscillation wavelength is 484 nm and the spectral line width of the laser oscillation line is 0.9 nm.

Figure 17:
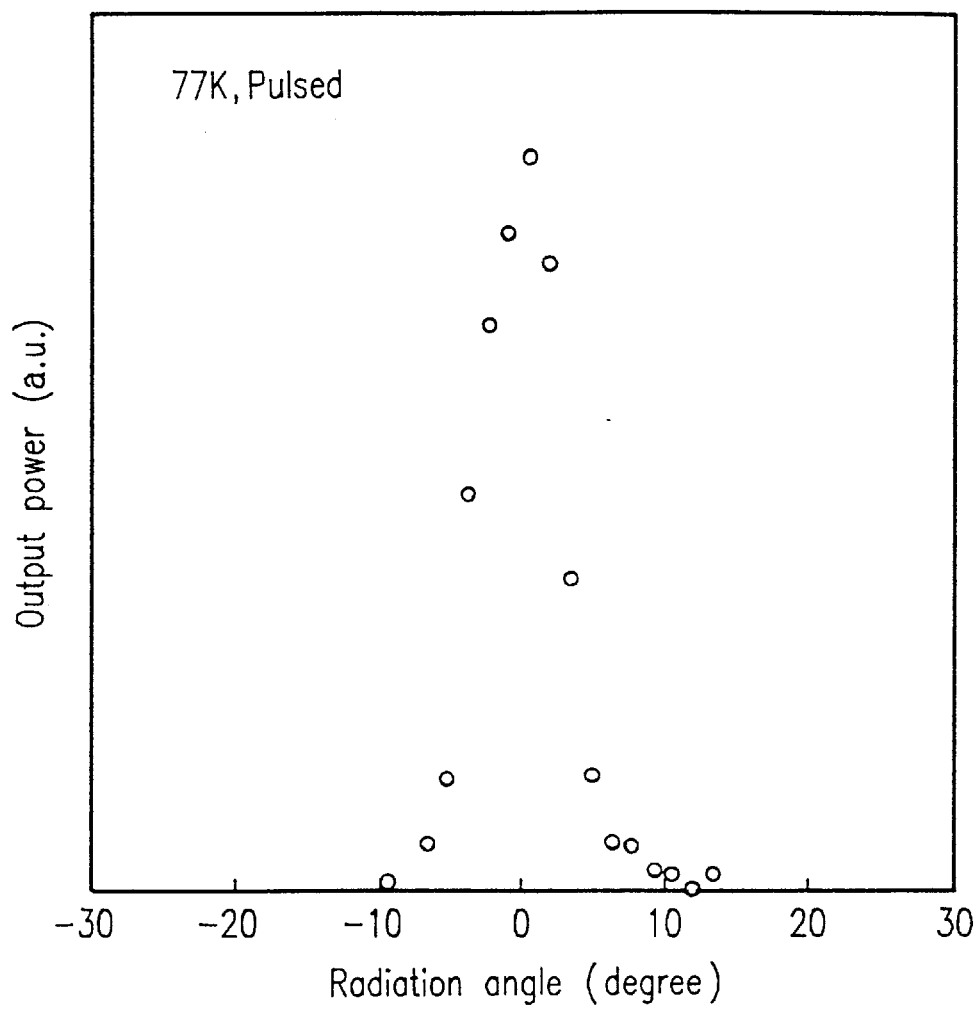
FIG. 17 is a graph showing a far-field pattern for the blue semiconductor laser shown in FIGS. 13A through 13C.

FIG. 17 shows a far-field pattern of the vertical resonator type blue semiconductor laser 400 of the present embodiment. Specifically, it shows the measured results obtained during a pulsed operation at the liquid nitrogen temperature (77K).

From the figure, it can be seen that the radiation angle obtained is about 7°, which is an extremely narrow angle. The reason is as follows. The semiconductor laser 400 of the present embodiment has the p type electrode structure in which the AuPd electrode 4016 makes contact with the N-doped p type ZnSe epitaxial layer 4014 in the ring-shaped area, and the polycrystalline ZnO burying structure further constricts the current into a cylindrical shape. Consequently, the current flows in cylindrical configuration from the AuPd electrode 4016 in a ring-shape and is injected into the multiquantum well layer 4013 which acts as the active layer. As a result, the laser beam to be emitted becomes round in shape. Since the diameter of the emitting facet is comparatively as large as 12 μm, an extremely small radiation angle can be obtained.

In forming the semiconductor laser 400 of the present embodiment, when the N-doped p type ZnSe epitaxial layer 4014 is etched using the resist pattern 4019 of a cylindrical shape (16 μm diameter) as a mask, a mixed solution of saturated bromine solution, phosphoric acid, and water (mixing ratio being, for example, 1:2:3) can possibly be used to conduct the wet etching instead of the aforementioned etchant. However, in a wet etching, there often arises surface roughness due to etching or the difficulty of obtaining a smoothly etched side wall. On the other hand, a dry etching using a hydrocarbon based gas is recently receiving much attention as a method of fine processing on compound semiconductors, and there have been several reports on a reactive ion etching on ZnSe using a hydrocarbon based gas for example, in Nikaido et al., The Extended abstracts of the Spring Convention of the Japanese Society of Applied Physics (1995), 30p-ZN-15, or in Ohtsuka et al., J. Appl. Phys. 75 (1994) 8231. Even with this dry etching using a hydrocarbon based gas, however, there are some problems such as a slow etching rate.

In the present invention, however, an ECR etching which uses a mixed gas which combines Xe gas to $CH_4/H_2$ based gas is conducbased gas is conducted.

Figure 18:
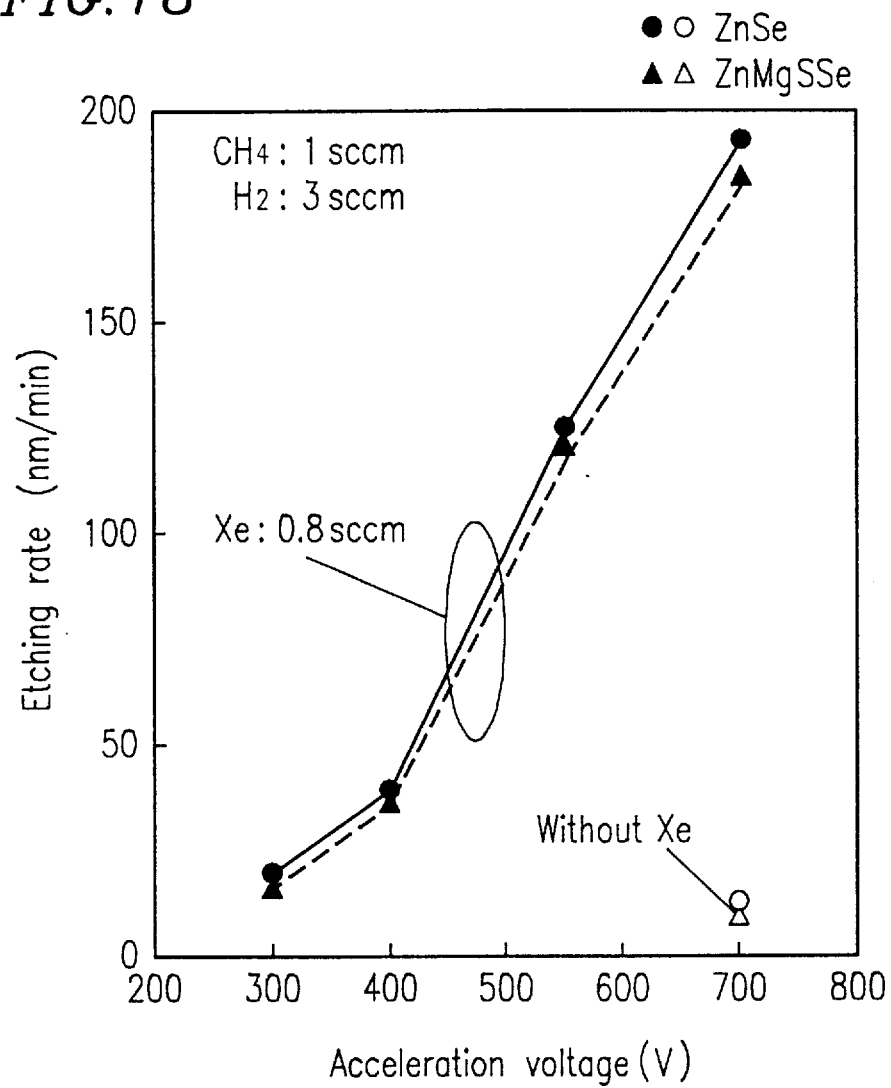
FIG. 18 is a graph showing the etching rate vs. acceleration voltage characteristic of the blue semiconductor laser shown in FIGS. 13A through 13C.

FIG. 18 is a graph illustrating an acceleration voltage dependence of the etching rate. Specifically, it illustrates data obtained during etching a ZnSe layer and a ZnMgSSe layer grown on a GaAs substrate by MBE with two different gases, one being a mixed gas of $CH_4$ gas and $H_2$ gas and another being this mixed gas further including Xe gas.

From the graph, it can be seen that when Xe gas is added to discharge gas, the etching rate rapidly increases as the acceleration voltage increases in either case of ZnSe or ZnMgSSe. For example, for an accelerating voltage of 700 V, the etching rate becomes about 20 times greater than that without introducing Xe gas in either case of ZnSe or ZnMgSSe.

The data shown in FIG. 18 are obtained for the gas flow rate of $CH_4$ being 1 sccm, the gas flow rate of $H_2$ being 3 sccm, and the gas flow rate of Xe being 0.8 sccm. However, specific values are not limited thereto, and if a condition that the ratio of the flow rate of the Xe to the flow rate of the $CH_4$ ($Xe/CH_4$) is more than 0.5 and less than 1.5 (i.e., $0.5 < Xe/CH_4 < 1.5$) is satisfied, carbon compound formed on the etching surface can effectively be removed due to the action of the Xe gas, and the etching characteristics such as the one described above can possibly be obtained.

Figure 19A:
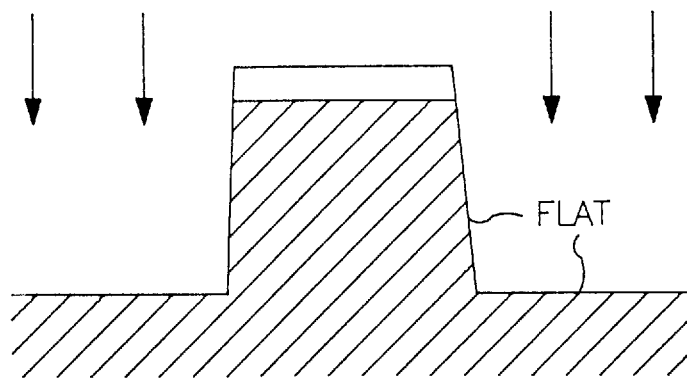
FIG. 19A is a cross-sectional view schematically illustrating a resultant configuration obtained by a dry-etching in accordance with the present invention using $CH_4$ and $H_2$ with introduced Ar.
Figure 19B:
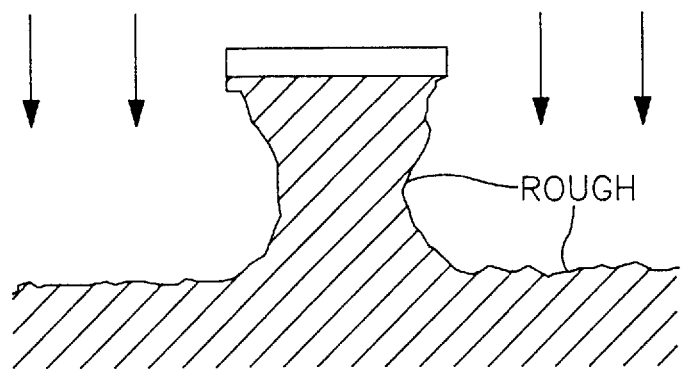
FIG. 19B is a cross-sectional view schematically illustrating a resultant configuration obtained by a conventional dry-etching technique using $Cl_2$.

FIG. 19A is a cross-sectional view schematically illustrating the etched shape obtained by a dry etching which uses methane and hydrogen added with Xe gas in accordance with the present embodiment, and FIG. 19B is a cross-sectional view schematically illustrating an etched shape obtained by a dry etching which uses chlorine in accordance with the conventional art. According to the method of the present embodiment, as shown in FIG. 19A, the etched surface obtained is extremely flat, while the etched surface is roughened in the conventional technique as shown in FIG. 19B. In particular, in the vertical direction, a smooth etched side wall with an etching angle of about 80° can be obtained.

The side wall having excellent verticality such as this is advantageous in realizing effective current constriction. If the side wall is not formed vertically but has a cross-section of a trapezoidal shape with a spreading base, the current is not sufficiently constricted but spreads, and the current does not concentrate in the active layer. However, by introducing the Xe gas and conducting the dry etching as in the present embodiment, an etched side wall with excellent verticality is formed and a structure suitable for current constriction is obtained.

Figure 20:
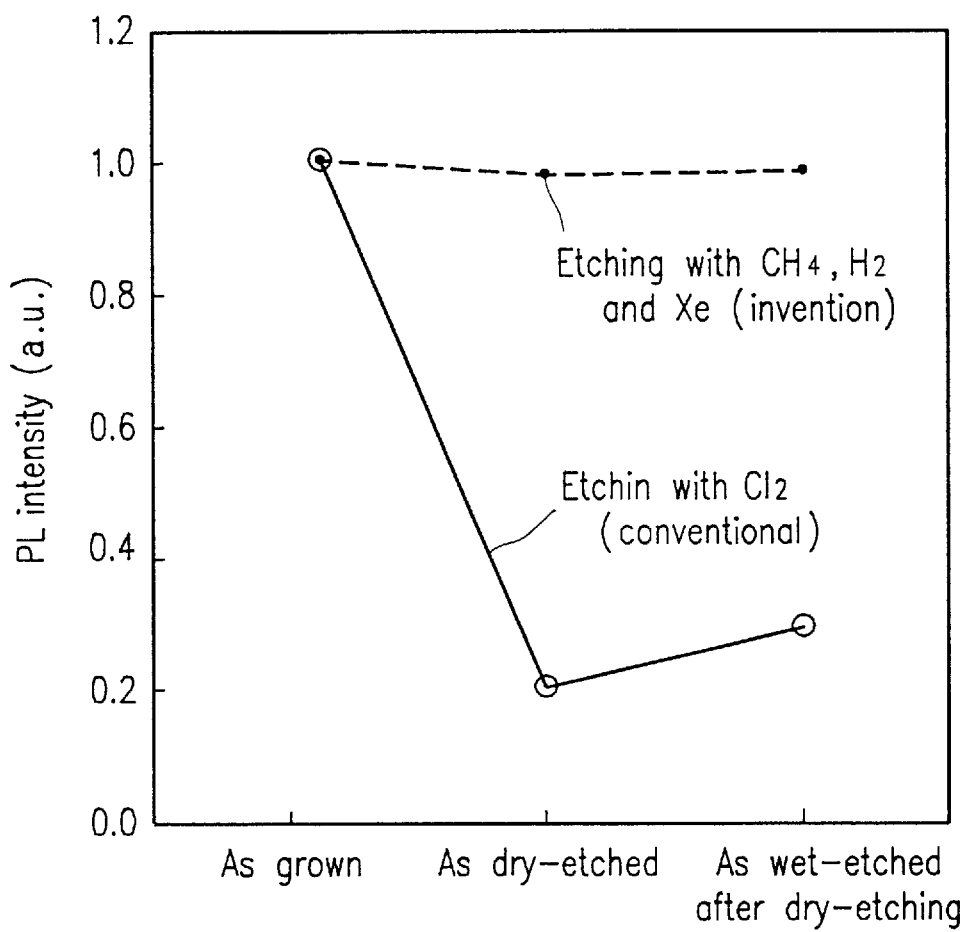
FIG. 20 is a graph illustrating changes in PL intensities before and after the dry-etching.

FIG. 20 is a graph illustrating changes in PL intensities measured as grown (before etching), as dry-etched, and as wet-etched after the dry-etching is completed, respectively, for both a dry etching using methane and hydrogen added with Xe gas in accordance with the present embodiment and a dry etching using chlorine in accordance with the conventional art. In the dry etching using chlorine in accordance with the conventional art, the PL intensity rapidly decreases after the implementation of the dry etching. On the other hand, in the dry etching by methane and hydrogen added with Xe gas of the present embodiment, the decrease in the PL intensity is hardly observed even after the implementation of the dry etching. This means that damage inflicted upon the to-be-processed surface by the etching is extremely small in the dry etching by methane and hydrogen added with the Xe gas of the present embodiment.

Although, in the above description, etching characteristics toward ZnSe and ZnMgSSe are described, the equivalent etching rate can be realized and a similarly smoothly etched surface can also be obtained for ZnSSe or CdZnSe.

The polycrystalline ZnO burying layer 4015 is used for current constriction as described above. This is for the reasons to be described below.

In a III–V group compound semiconductor laser such as GaAs, a polycrystalline $SiO_2$ burying layer is conventionally used. This polycrystalline $SiO_2$ burying layer is typically formed by chemical vapor deposition or the like. However, the crystal growth temperature of a ZnSe series II–VI group compound semiconductor material is generally about 250° C., which is very low. Therefore, in order not to generate crystal deterioration in the ZnSe series II–VI group compound semiconductor layer during the step of forming the polycrystalline $SiO_2$ burying layer which is conducted after the formation of a layer made of a ZnSe series II–VI group compound semiconductor material, the polycrystalline $SiO_2$ burying layer must be formed with a temperature lower than the growth temperature of the ZnSe series II–VI group compound semiconductor layer.

However, $SiO_2$ formed with such low temperature becomes a porous polycrystalline. As a result, the adhesion to a ZnSe layer or the like becomes extremely poor so that a peel or the like easily occurs. Therefore, it is questionable to use $SiO_2$ as an insulating burying layer. Moreover, also in a case where the polycrystalline $SiO_2$ burying layer is used as a mask during etching, side etch or the like is likely to occur due to its poor adhesion or porous property, and it is not a valuable mask material.

Furthermore, since the thermal conductivity of polycrystalline $SiO_2$ is considerably small, generated heat does not efficiently diffuse. As a result, the threshold value for laser oscillation increases and the life of the light emitting device is shortened.

Therefore, in the present embodiment, the burying layer 4015 is formed by using polycrystalline ZnO as a material which can be formed with good adhesion on the epitaxial layer in the II–VI group semiconductor laser structure, has high thermal conductivity, and has small refractive index so that it can possibly be used for light confinement.

The ZnO layer used as a material for the insulating burying layer in the present invention is one of II–VI group compound semiconductor materials, and has extremely excellent adhesiveness for materials such as ZnSe, ZnSSe, and ZnMgSSe. It also has excellent anti-acid and anti-oxidation properties. Furthermore, it has almost zero water absorption property and excels in the stability of shape and dimensions.

Moreover, ZnO has extremely a good thermal conductive property and its thermal conductivity is almost 30 times that of $SiO_2$. Therefore, by using ZnO as the insulating burying layer, heat generated in the active layer efficiently diffuses through the ZnO insulating burying layer.

Furthermore, ZnO has a smaller refractive index compared with ZnSe, ZnSSe, ZnMgSSe, etc., and the difference therebetween is in the preferable range.

Specifically, the refractive index of the cladding layer is typically about 2.5 to 2.6, while that of the ZnO layer constituting the insulating burying layer is typically about 2.2. When a difference of refractive index between the cladding layer and the insulating burying layer is in such a range, a stable single transverse mode laser oscillation is achieved even with a cladding layer having a cylindrical portion with an enlarged diameter as large as 5 to 10 $\mu$m. Contrary to the above, the conventional $SiO_2$ insulating burying layer typically has a refractive index of about 1.4, resulting in a large difference with respect to the refractive index of the cladding layer. As a result, in order to achieve a stable single transverse mode laser oscillation, the diameter of the cylindrical portion in the cladding layer has to be reduced to about 2 $\mu$m. it is, however, difficult to fabricate the cylindrical portion with such a small diameter.

Thus, the ZnO insulating burying layer effectively functions as a light confinement layer in the lateral direction.

In the above description, sputtering is used for forming the polycrystalline ZnO burying layer 4015 and the multifilm reflecting mirrors 4017p and 4017n constituted of polycrystalline $SiO_2$ layers and polycrystalline $TiO_2$ layers. However, in order to increase the depositing rates of these layers even in a case where the process temperature is sufficiently low, it is effective to introduce oxygen in plasma form to the sputtering apparatus as described in conjunction with the first embodiment with FIG. 3 being referred to. The oxygen which turns into plasma by the electrical discharge is taken into a film such as ZnO deposited on the II–VI group semiconductor substrate. This can prevent the oxygen in the deposited film from dropping out, and a good quality film can be obtained. Furthermore, even in a low process temperature, the depositing rate of the film such as ZnO increases several times than of the depositing method of the conventional art.

Particularly in the $TiO_2$ film, when oxygen drops out from a film during the sputtering step, the absorption edge shifts toward the longer wavelength side. As a result, the absorption loss with respect to wavelengths of blue laser light increases, which then introduces the decrease in the reflectivity of the multifilm reflecting mirrors 4017p and 4017n. On the other hand, by introducing oxygen into the sputtering step, the drop out of the oxygen can be suppressed. As a result, the reflectivity of the multifilm reflecting mirrors 4017p and 4017n constituted of the polycrystalline $SiO_2$ layers and the polycrystalline $TiO_2$ layers can be raised. For example, in the present embodiment, in the multifilm structure made of polycrystalline $SiO_2$ layers and polycrystalline $TiO_2$ layers deposited with the periodicity of the total of eight, a reflectivity higher than 99% for a 490 nm wavelength can be obtained.

Figure 21:
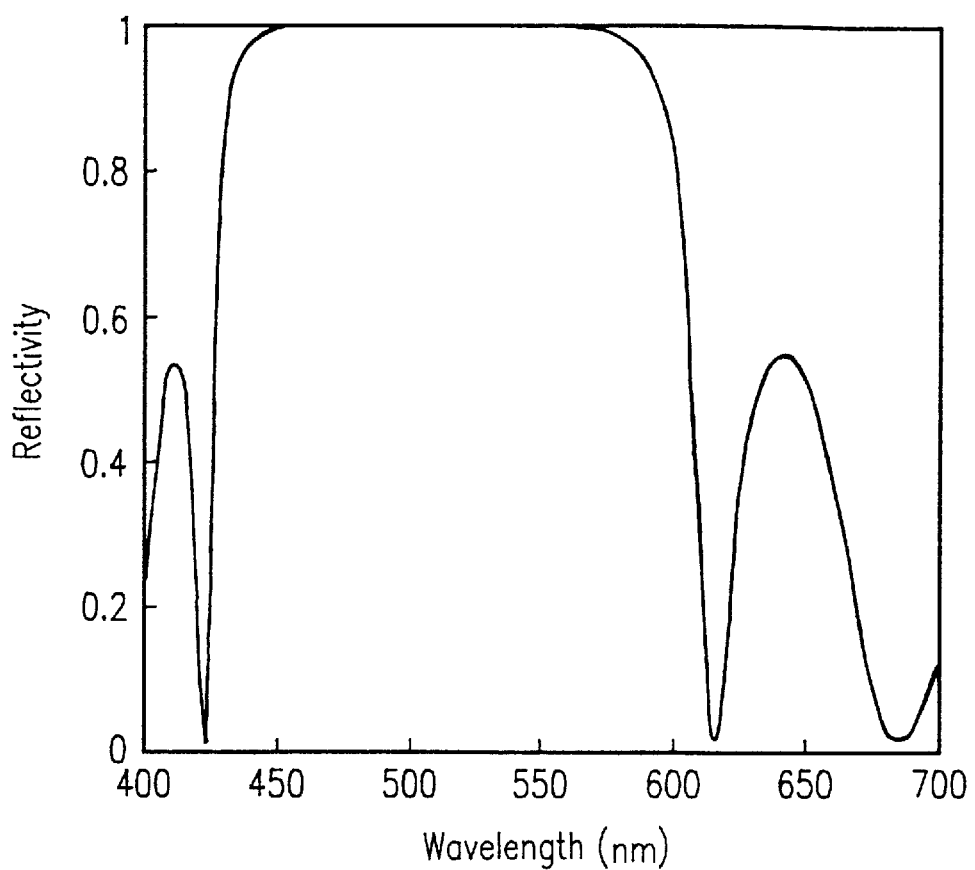
FIG. 21 is a graph illustrating reflectivity distribution of the multifilm reflecting film in the vertical resonator type blue semiconductor laser shown in FIGS. 13A through 13C.

FIG. 21 is a graph illustrating the reflectivity distribution over wavelengths of the multilayer reflecting film formed in accordance with the present embodiment. From this result, it can be said that the multifilm reflecting mirrors 4017p and 4017n which have good controllability on the film thickness, from which the drop-out of oxygen is suppressed, and which has large reflectivity, is obtained from the multifilm constituted of polycrystalline $SiO_2$ layers and polycrystalline $TiO_2$ layers according to the present embodiment. Therefore, the multifilm reflecting mirrors 4017p and 4017n which are formed in accordance with the present embodiment are considerably effective as the reflecting mirrors for a vertical resonator type semiconductor laser which must have an extremely large reflectivity.

As described above, the n type AuGeNi electrode 4018 is used in the present embodiment for the reasons below.

In order to facilitate the photolithographic process toward the rear surface of the semiconductor laser, In sticking to the Si-doped n type GaAs substrate 4011 is removed and then the etching is conducted. That is, in order to conduct the above process, a new n type electrode must be fabricated because the In used for an attachment purpose during crystal growth cannot be used directly as the n type electrode. Since a ZnSe series II–VI group semiconductor generally grows at a low temperature which is lower than 300° C., it is necessary to form an ohmic contact at a process temperature (sinter temperature) as low as possible. For that purpose, it is effective to form the electrode 4018 from n type AuGeNi.

Table 1 lists the heat treatment temperatures required for the forming process (i.e., process temperature) and the contact resistances obtained thereby for a variety of metal materials which can be used as the constituting material of the electrode. From the table, when the multilayer structure of AuGeNi is used, an excellent ohmic contact is obtained by the heat treatment at 230° C. for five minutes, and the contact resistance is then about $5 \times 10^{-3}$ $\Omega \cdot cm^2$.

TABLE 1

| | Material | | | |
|---|---|---|---|---|
| | InSn | AuSn | AuGeNi | AuGe |
| Process temperature (°C.) | 275 | 245 | 230 | 275 |
| Contact resistance ($\Omega \cdot cm^2$) | $1.84 \times 10^{-2}$ | $4.15 \times 10^{-2}$ | $5.00 \times 10^{-3}$ | $8.18 \times 10^{-13}$ |

EXAMPLE 5

A semiconductor laser 500 according to a fifth embodiment of the present invention will be described with reference to the figures.

The semiconductor laser 500 of the present embodiment is a blue surface emitting laser using an active layer made of a ZnMgSSe epitaxial layer and a ZnSe well layer in a II–VI group semiconductor laser structure. Because of this structure, epitaxial growth of the II–VI group semiconductor material on the GaAs substrate, which lattice-matches thereto, is possible. Thus, crystal quality further improves, which is advantageous to laser oscillation at room temperature. Furthermore, since the ZnSe well layer can be used in the active layer, the laser oscillation wavelength at a room temperature can further be made small.

FIGS. 22A to 22C illustrate the structure of a vertical resonator type blue semiconductor laser 500 using a ZnSe series II–VI group semiconductor according to the present embodiment. Specifically, FIG. 22A is an isometric view illustrating the appearance of the semiconductor laser 500, and FIG. 22B is a cross-sectional view taken along the line 22B—22B in FIG. 22A. Moreover, FIG. 22C three-dimensionally shows the cross-section illustrated in FIG. 22B.

In the semiconductor laser 500, a Cl-doped n type ZnMgSSe epitaxial layer (cladding layer) 5112, a multi-quantum well layer 5113 which is constituted of ZnSe well layers and ZnMgSSe barrier layers and functions as an active layer, and an N-doped p type ZnMgSSe epitaxial layer (cladding layer) 5114 are deposited in this order on an Si-doped n type GaAs substrate 5111. Disposed on both sides of the p type ZnMgSSe epitaxial layer 5114 is a polycrystalline ZnO burying layer 5115 to constrict current. Multifilm reflecting mirrors 5117p and 5117n are formed on the p type ZnMgSSe epitaxial layer 5114 and on the surface of the n type ZnMgSSe layer 5112 exposed by etching a part of GaAs substrate 5111, respectively, and they function as reflecting mirrors for obtaining laser oscillation. Furthermore, a p type AuPd electrode 5116 is formed on the ZnO burying layer 5115 so as to cover the reflecting mirror 5117p, and on the other hand, an n type AuGeNi electrode 5118 is provided on the rear surface of the n type GaAs substrate 5111.

In the isometric view of FIG. 22A, the reflecting mirror 5117p is invisible as it is covered with the electrode 5116. The reflecting mirror 5117n is also invisible in FIG. 22A which is formed at the location corresponding to the bottom of the aperture (window) 5119 provided at the center of the GaAs substrate 5111. From FIG. 22C, it can be seen that the reflecting mirror 5117p is cylindrical in shape. The oscillated laser light is emitted in a direction indicated with an arrow, through the aperture 5119 of the GaAs substrate 5111.

In the present embodiment, the Cl-doped n type ZnMgSSe epitaxial layer 5112 and the N-doped p type ZnMgSSe epitaxial layer 5114 can be grown and lattice-matched with the GaAs substrate 5111. Therefore, an epitaxial layer of high quality can be obtained. As a result, laser oscillation at a room temperature can be obtained. The threshold current is about 3 mA and is also extremely small in this case. Moreover, the laser oscillation wavelength is 464 nm, which is shorter than that of the semiconductor laser 100 in the first embodiment. Furthermore, a radiation angle of about 7° is obtained, which is extremely small.

EXAMPLE 6

A semiconductor laser 600 of a sixth embodiment of the present invention will be described with reference to the figures.

The semiconductor laser 600 of the present embodiment is a blue surface emitting laser using a ZnMgSSe epitaxial layer as a burying layer. In the present embodiment, an $SiO_2$ mask of a cylindrical shape (16 μm diameter) is first formed on the N-doped p type ZnSe epitaxial layer 6124 and, then, using it as a mask, the N-doped p type ZnSe epitaxial layer 6124 is etched. By epitaxially growing the ZnMgSSe epitaxial layer 6125 thereafter with the SiO. being left thereon, the ZnMgSSe is selectively grown only on the etched area since ZnMgSSe does not grow on the $SiO_2$ mask. Consequently, the burying structure by the ZnMgSSe epitaxial layer 6125 is formed.

Figure 23A:
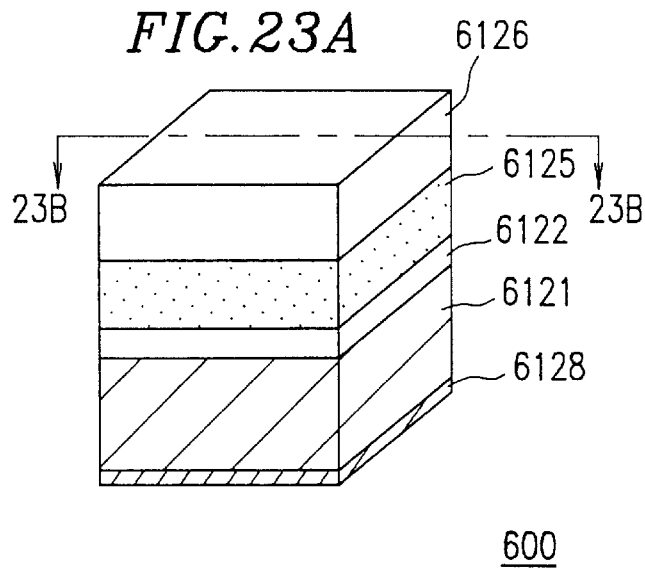
FIG. 23A is an isometric view illustrating a vertical resonator type blue semiconductor laser in accordance with a sixth embodiment of the present invention.
Figure 23B:
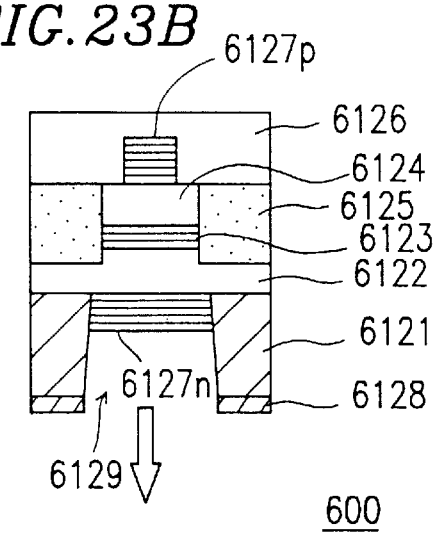
FIG. 23B is a cross-sectional view taken along line 23B—23B in FIG. 23A.
Figure 23C:
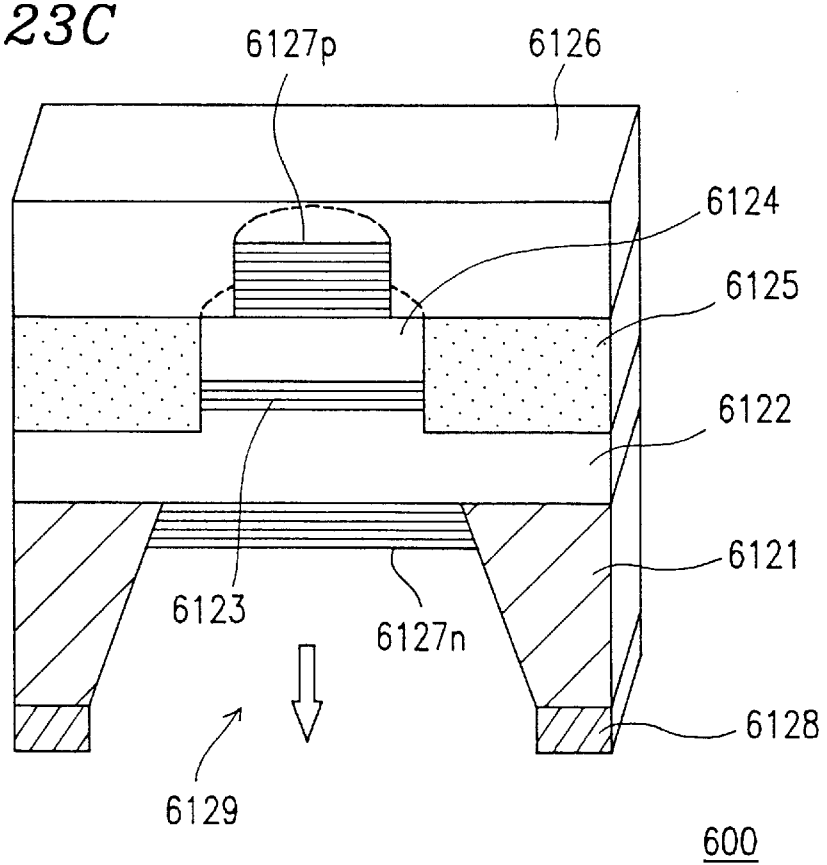
FIG. 23C is a view three-dimensionally illustrating the cross-sectional view shown in FIG. 23B.
Figure 25:
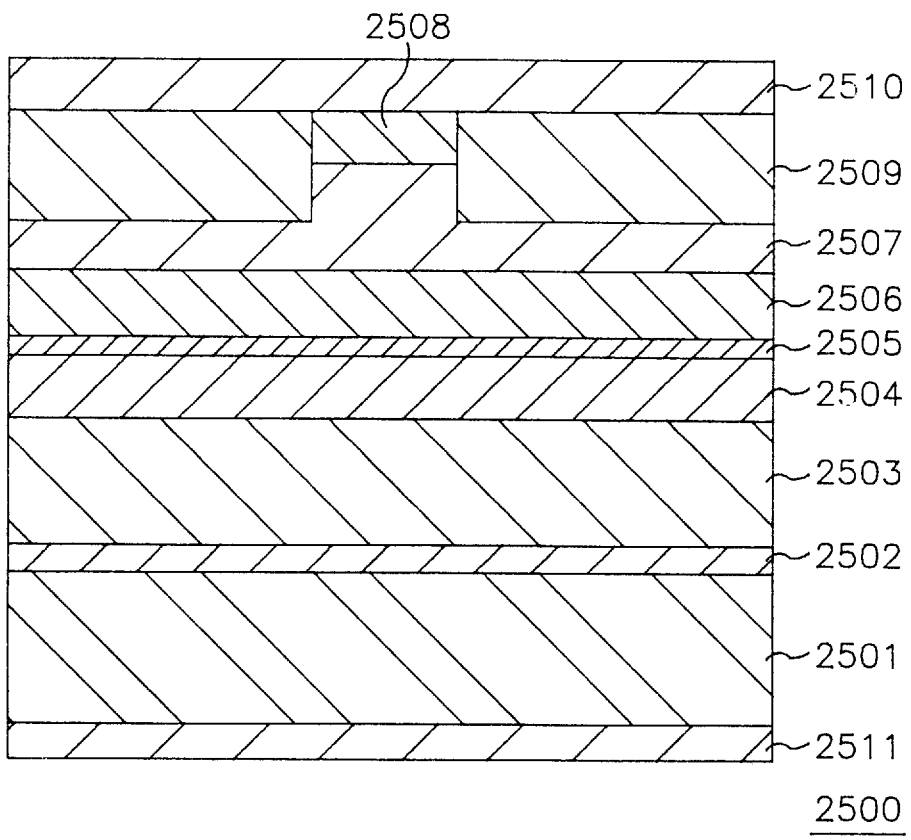
FIG. 25 is a cross-sectional view illustrating a conventional blue semiconductor laser.
Figure 26:
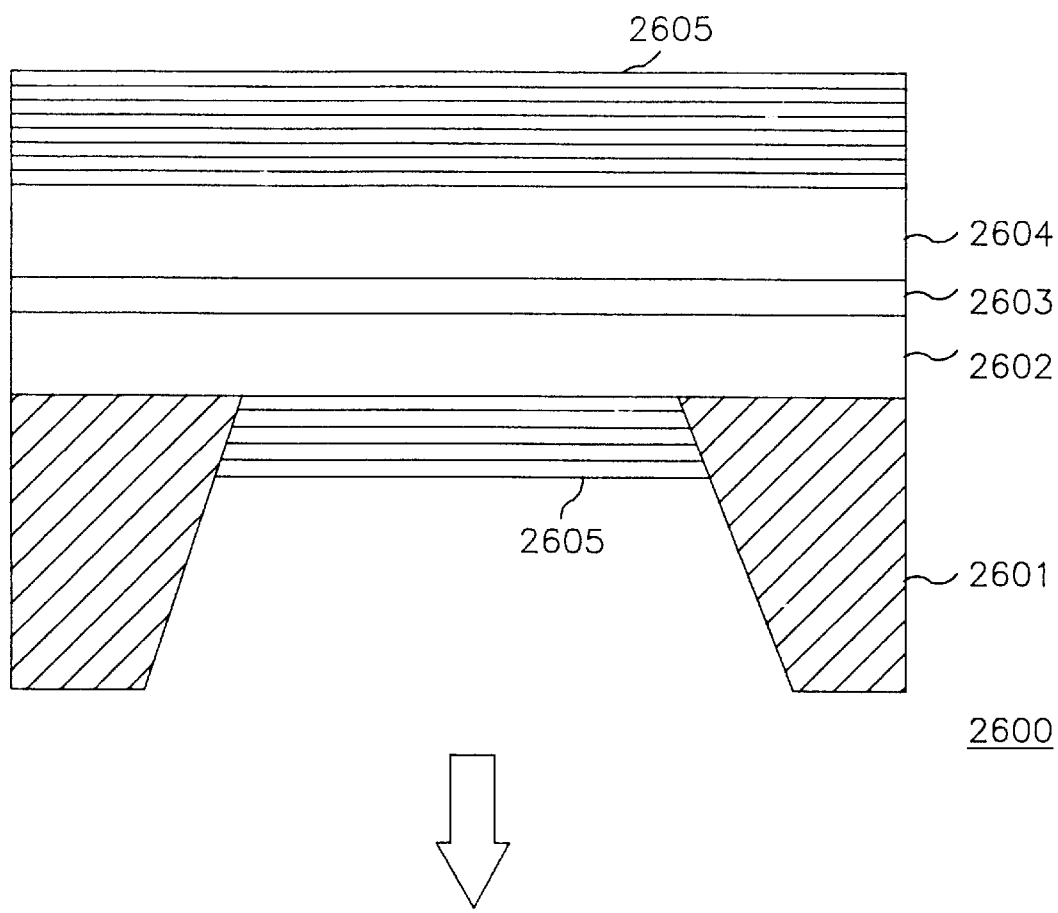
FIG. 26 is a cross-sectional view illustrating a conventional vertical resonator type blue semiconductor laser.

FIGS. 23A to 23C illustrate the structure of a vertical resonator type blue semiconductor laser 600 using a ZnSe series II–VI group semiconductor according to the present embodiment. Specifically, FIG. 23A is an isometric view illustrating the appearance of the semiconductor laser 600, and FIG. 23B is a cross-sectional view taken along the line 23B—23B in FIG. 23A. Moreover, FIG. 23C three-dimensionally shows the cross-section illustrated in FIG. 23B.

In the semiconductor laser 600, a Cl-doped n type ZnSe epitaxial layer (cladding layer) 6122, a multiquantum well layer 6123 which is constituted of ZnCdSe well layers and ZnSe barrier layers and functions as an active layer, and an N-doped p type ZnSe epitaxial layer (cladding layer) 6124 are deposited in this order on an Si-doped n type GaAs substrate 6121. Disposed on both sides of the p type ZnSe epitaxial layer 6124 is a ZnMgSSe epitaxial layer 6125 as a burying layer to constrict current. Multifilm reflecting mirrors 6127p and 6127n are formed on the p type ZnSe epitaxial layer 6124 and on the surface of the n type ZnSe layer 6122 exposed by etching a part of GaAs substrate 6121, respectively, and they function as reflecting mirrors for obtaining laser oscillation. Furthermore, a p type AuPd electrode 6126 is formed on the burying layer (AnMgSSe epitaxial layer) 6125 so as to cover the reflecting mirror 6127p, and on the other hand, an n type AuGeNi electrode 6128 is provided on the rear surface of the n type GaAs substrate 6121.

In the isometric view of FIG. 23A, the reflecting mirror 6127p is invisible as it is covered with the electrode 6126. The reflecting mirror 6127n is also invisible in FIG. 23A which is formed at the location corresponding to the bottom of the center of the GaAs substrate 6121. From FIG. 23C, it can be seen that the reflecting mirror 6127p is cylindrical in shape.

The ZnMgSSe epitaxial layer 6125 is thermally more highly conductive than polycrystals or the like. Consequently, by using the ZnMgSSe epitaxial layer 6125 as the burying layer 6125 to current constriction, the thermal diffusion during laser oscillation is conducted more efficiently, and the realization of smaller threshold current and higher laser output can further be put forward.

EXAMPLE 7

A semiconductor laser 700 in a seventh embodiment of the present invention will be described with reference to the figures.

The semiconductor laser 700 of the present embodiment is a blue surface emitting laser having a multifilm reflecting mirror constituted of a ZnMgSSe epitaxial layer and a ZnSe epitaxial layer.

The polycrystalline SiO$_2$ layer and the polycrystalline TiO$_2$ layer which are used as the materials for the multifilm reflecting mirrors in the embodiments described so far are insulators. As a result, current cannot be injected through the multifilm reflecting mirror constituted of these materials. However, when a multifilm reflecting mirror constituted of the ZnMgSSe epitaxial layer and the ZnSe epitaxial layer are added with appropriate impurities, conductivity can be obtained, and current injection therethrough becomes possible. As a result, efficient current constriction becomes possible and the reduction of the threshold current can be realized.

FIGS. 24A to 24C illustrate a structure of a vertical resonator type blue semiconductor laser 700 using a ZnSe series II–VI group semiconductor according to the present embodiment. Specifically, FIG. 24A is an isometric view illustrating the appearance of the semiconductor laser 700, and FIG. 24B is a cross-sectional view taken along the line 24B—24B in FIG. 24A. Moreover, FIG. 24C three-dimensionally shows the cross-section illustrated in FIG. 24B.

In the semiconductor laser 700, an n type multifilm reflecting mirror 7132n constituted of a Cl-doped ZnMgSSe epitaxial layer and a ZnSe epitaxial layer, a ZnCdS active layer 7133, and a p type multifilm reflecting mirror 7132p constituted of an N-doped ZnMgSSe epitaxial layer and a ZnSe epitaxial layer are deposited in this order on an Si-doped n type GaAs substrate 7131. Disposed on both sides of the active layer 7133 is a polycrystalline ZnO burying layer 7134 for constricting current. Furthermore, a p type AuPd electrode 7135 is formed on the ZnO burying layer 7134, and on the other hand, an n type AuGeNi electrode 7136 is provided on the rear surface of the n type GaAs substrate 7131.

As described above, in the fourth to seventh embodiments of the present invention, current can effectively be injected into the active layer region interposed between the multifilm reflecting mirror and further be constricted, due to the above-mentioned structure of the vertical resonator type blue semiconductor laser. The vertical resonator type blue semiconductor laser of current driven type can thereby be obtained.

Moreover, etching which inflicts less damage to the II–VI group semiconductor material layer constituting the vertical resonator type blue semiconductor laser but has a high etching rate and excellent verticality becomes possible. As a result, it becomes possible to form a structure which effectively constricts current.

Furthermore, in the multifilm reflecting mirror of the present invention which is constituted of a polycrystalline SiO$_2$ layer and a polycrystalline TiO$_2$, the difference between the refractive indices of SiO$_2$ and TiO$_2$ is large. Furthermore, by preventing the drop out of oxygen in the TiO$_2$, sufficient transmittance toward wavelengths in blue region can be achieved. High reflectivity can thereby be obtained.

Moreover, the reflecting mirror of multilayer film made of the polycrystalline SiO$_2$ layer and the poly crystalline TiO$_2$ layer is also formed against the Cl-doped n type ZnSe epitaxial layer. Thus, a window from which the laser output is taken out can be formed by removing a part of the rear surface of the GaAs substrate, and the surface of the Cl-doped n type ZnSe epitaxial layer can be formed extremely smooth so as not to reduce the reflectivity.

Moreover, an electrode for the n type GaAs can be formed in low temperature process after forming the window from which the laser light is emitted.

In the structure of the vertical resonator type blue semiconductor laser of the present invention described above, current can effectively injected into the active layer region interposed between the multilayer film reflecting mirror and be further constricted. Because of this structure, the gain can be made large. As a result, the vertical resonator type blue semiconductor laser of current driven type is thereby obtained.

Moreover, complying with the present invention, a high etching rate can be realized while reducing the damage inflicted upon the semiconductor material during the etching of the II–VI group semiconductor material, and the processing with excellent verticality becomes possible. Because of this, a smoothly etched lateral surface can be obtained. As a result, a structure which effectively constricts the current can be fabricated and, at the same time, the threshold current can be reduced.

Since high reflectivity can be obtained in the multilayer film reflecting mirror constituted of the polycrystalline SiO$_2$ layer and the polycrystalline TiO$_2$ because of the large difference of the refractive indices between the SiO$_2$ and the TiO$_2$, the threshold current can be reduced. Moreover, by preventing the drop out of the oxygen in the TiO$_2$, the transmittance against the wavelengths in blue region can be achieved.

Furthermore, according to the present invention, when a window from which the laser output is taken out is formed by removing a part of the rear surface of the GaAs substrate of the semiconductor laser and the multilayer film reflecting mirror constituted of the polycrystalline SiO$_2$ layer and the polycrystalline TiO$_2$ layer is formed against the Cl-doped n type ZnSe epitaxial layer, the surface of the Cl-doped n type ZnSe epitaxial layer can be formed extremely smooth. Because of this, the decrease in the reflectivity due to optical scattering can be controlled, and the threshold current can be reduced.

Furthermore, it becomes possible to form the electrode which makes contact with the n type GaAs through low contact resistance in low temperature process after forming the window from which laser light is emitted. As a result, the drive current can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device comprising:
   an active layer made of a II–VI group compound semiconductor;
   a first cladding layer and a second cladding layer respectively made of a II–VI group compound semiconductor which are formed so as to interpose the active layer therebetween; and
   a ZnO burying layer formed on the first cladding layer so as to exhibit both a current constriction function and a light confinement function,
   wherein the semiconductor light emitting device oscillates in a single transverse mode.

2. A semiconductor light emitting device according to claim 1, wherein the ZnO current constriction layer is formed by an oxygen ion implantation into a predetermined portion of a II–VI group semiconductor epitaxial layer structure, and the ZnO current constriction layer includes oxygen atoms at $1 \times 10^{14}$ cm$^{-3}$ or more.

3. A semiconductor light emitting device according to claim 2, wherein the II–VI group semiconductor epitaxial layer structure includes a laser structure.

4. A semiconductor light emitting device comprising:
   a substrate; and
   an n type cladding layer, an active layer, a p type cladding layer and a p type contact layer, respectively made of a II–VI group compound semiconductor, which are epitaxially grown in this order on the substrate,
   wherein the p type contact layer is formed in a striped-shape, and
   a burying layer made of ZnO is further formed on both portions of the p type cladding layer which are located on both sides of the stripe-shaped p type contact layer so as to exhibit both a current constriction function and a light confinement function,
   wherein the semiconductor light emitting device oscillates in a single transverse mode.

5. A semiconductor light emitting device, according to claim 4, wherein the ZnO current constriction layer is formed by an oxygen ion implantation into a predetermined portion of a II–VI group semiconductor epitaxial layer structure, and the ZnO current constriction layer includes oxygen atoms at $1 \times 10^{14}$ cm$^{-3}$ or more.

6. A semiconductor light emitting device according to claim 5, wherein the II–VI group semiconductor epitaxial layer structure includes a laser structure.

7. A semiconductor light emitting device comprising:
   an active layer made of a II–VI group compound semiconductor;
   an upper cladding layer and a lower cladding layer respectively made of a II–VI group compound semiconductor which are formed so as to interpose the active layer therebetween; and
   a ZnO burying layer formed on the upper cladding layer, an oxygen ion being implanted into the burying layer,
   wherein the ZnO burying layer exhibits both a current constriction function and a light confinement function, and
   the semiconductor light emitting device oscillates in a single transverse mode.

8. A semiconductor light emitting device comprising:
   a substrate;
   an n type cladding layer, an active layer, a p type cladding layer and a p type contact layer, respectively made of a II–VI group compound semiconductor, which are epitaxially grown on this order on the substrate,
   wherein the p type contact layer is formed in a striped-shape, and
   a ZnO burying layer into which an oxygen ion is implanted is further formed on both portions of the p type cladding layer which are located on both sides of the stripe-shaped p type contact layer,
   wherein the ZnO burying layer exhibits both a current constriction function and a light confinement function, and
   the semiconductor light emitting device oscillates in a single transverse mode.

9. A vertical resonator type light emitting device comprising:
   a light emitting layer;
   a p type epitaxial layer and an n type epitaxial layer respectively made of a II–VI group semiconductor material which are formed so as to interpose the light emitting layer therebetween; and
   a ZnO current constriction layer formed on at least one of the p type epitaxial layer and the n type epitaxial layer,
   wherein the ZnO current constriction layer exhibits both a current constriction function and a light confinement function, and
   the light emitting device oscillates in a single transverse mode.

10. A vertical resonator type light emitting device according to claim 9, wherein a mesa is formed on one of the p type epitaxial layer and the n type epitaxial layer which is formed on the light emitting layer, and the ZnO current constriction layer is formed on both sides of the mesa.

11. A vertical resonator type light emitting device according to claim 9, further comprising an electrode formed on at least one of the p type epitaxial layer and the n type epitaxial layer in contact thereto in a ring-shape.

12. A disk apparatus having an improved semiconductor laser, wherein the improvement of the semiconductor laser comprises:
   a light emitting layer;
   a p type epitaxial layer and an n type epitaxial layer respectively made of a II–VI group semiconductor material which are formed so as to interpose the light emitting layer therebetween; and
   a ZnO current constriction layer formed on at least one of the p type epitaxial layer and the n type epitaxial layer, wherein the ZnO current constriction layer exhibits both a current constriction function and a light confinement function, and the light emitting device oscillates in a single transverse mode.

13. A vertical resonator type light emitting device comprising:

a light emitting layer;

a p type epitaxial layer and an n type epitaxial layer respectively made of a II–VI group semiconductor material which are formed so as to interpose the light emitting layer therebetween;

a ZnO current constriction layer, formed on at least one of the p type epitaxial layer and the n type epitaxial layer, for exhibiting both a current constriction function and a light confinement function;

a reflecting mirror, formed in a region surrounded with the ZnO current constriction layer, for reflecting light; and an electrode being in contact, in a ring-shape, with the epitaxial layer disposed between the reflecting mirror and the ZnO current constriction layer, wherein the light emitting device oscillates in a single transverse mode.

14. A vertical resonator type light emitting device according to claim 13, wherein the reflecting mirror is a layered structure of $TiO_2$ and $SiO_2$.

15. A vertical resonator type light emitting device according to claim 13, wherein a layered structure including the p type epitaxial layer, the n type epitaxial layer and the ZnO current constriction layer is formed on a GaAs substrate, and the device further comprises an electrode made of Au, Ge and Ni, which is in contact with the GaAs substrate.

16. A disk apparatus having an improved semiconductor laser, wherein the improvement of the semiconductor laser comprises:

a light emitting layer;

a p type epitaxial layer and an n type epitaxial layer respectively made of a II–VI group semiconductor material which are formed so as to interpose the light emitting layer therebetween;

a ZnO current constriction layer, formed on at least one of the p type epitaxial layer and the n type epitaxial layer, for exhibiting both a current constriction function and a light confinement function;

a reflecting, mirror, formed in a region surrounded with the ZnO current constriction layer, for reflecting light; and an electrode being in contact, in a ring-shape, with the epitaxial layer disposed between the reflecting mirror and the ZnO current constriction layer, wherein the light emitting device oscillates in a single transverse mode.

17. A vertical resonator type light emitting device comprising:

a semiconductor substrate having an aperture of a predetermined shape;

a first epitaxial layer formed on the semiconductor substrate;

a light emitting layer formed on the first epitaxial layer;

a second epitaxial layer formed on the light emitting layer;

a ZnO current constriction layer, buried on both sides of a mesa which is formed in the second epitaxial layer, for exhibiting both a current constriction function and a light confinement function;

a first reflecting mirror formed on the second epitaxial layer so as to be surrounded with the ZnO current constriction layer; and a second reflecting mirror formed on a portion of a surface of the first epitaxial layer which is exposed through the aperture of the semiconductor substrate, wherein the light emitting device oscillates in a single transverse mode.

18. A vertical resonator type light emitting device according to claim 17, further comprising:

a first electrode formed on a portion of the first epitaxial layer which is interposed between the ZnO current constriction layer and the first reflecting mirror; and a second electrode formed on a surface of the semiconductor substrate.

19. A vertical resonator type light emitting device according to claim 17, wherein the semiconductor substrate is a GaAs substrate and the device further comprises an electrode made of Au, Ge and Ni, which is in contact with the GaAs substrate.

20. A vertical resonator type light emitting device according to claim 17, wherein each of the first and second reflecting mirrors is a layered structure of $TiO_2$ and $SiO_2$.

21. A disk apparatus having an improved semiconductor laser, wherein the improvement of the semiconductor laser comprises:

a semiconductor substrate having an aperture of a predetermined shape;

a first epitaxial layer formed on the semiconductor substrate;

a light emitting layer formed on the first epitaxial layer;

a second epitaxial layer formed on the light emitting layer;

a ZnO current constriction layer, buried on both sides of a mesa which is formed in the second epitaxial layer, for exhibiting both a current constriction function and a light confinement function;

a first reflecting mirror formed on the second epitaxial layer so as to be surrounded with the ZnO current constriction layer; and a second reflecting mirror formed on a portion of a surface of the first epitaxial layer which is exposed through the aperture of the semiconductor substrate, wherein the light emitting device oscillates in a single transverse mode.

22. A vertical resonator type light emitting device, comprising:

a light emitting layer; and a reflecting mirror, wherein the light emitting layer is made of a II–VI group compound semiconductor layer, and the device is a current injection type in which a current is injected into the light emitting layer, the device further comprises a ZnO current constriction layer formed in the vicinity of the light emitting layer, the ZnO current constriction layer exhibiting both a current constriction function and a light confinement function, and the light emitting device oscillates in a single transverse mode.

23. A vertical resonator type light emitting device according to claim 22, further comprising an epitaxial layer which includes the light emitting layer, the epitaxial layer being made of a II–VI group compound semiconductor.

24. A vertical resonator type light emitting device according to claim 22, wherein the reflecting mirror is made of a II–VI group compound semiconductor.

25. a vertical resonator type light emitting device according to claim 24, wherein the reflecting mirror is a layered structure of ZnSe and ZnMgSSe.

26. A vertical resonator type light emitting device according to claim 22, wherein the reflecting mirror is made of an oxide.

27. A vertical resonator type light emitting device according to claim 26, wherein the reflecting mirror is a layered structure of $TiO_2$ and $SiO_2$.

* * * * *

UNITED STATES PATENT AND TRADE MARK OFFICE
CERTIFICATE OF CORRECTION

PATENT NO. : 5,822,347
DATED : October 13, 1998
INVENTOR(S) : Yokogawa et al.

It is certified that error appears in the above-identified patent and that said Letters Patent is hereby corrected as shown below:

Column 9, line 59, "Zno" should read --ZnO--.

Column 27, line 46, after "reflecting" delete the comma ",".

Column 29, line 4, "a" should be --A--.

Signed and Sealed this

Thirtieth Day of March, 1999

Attest:

Q. TODD DICKINSON

*Attesting Officer*　　　*Acting Commissioner of Patents and Trademarks*